US010367133B1

(12) United States Patent
Tahan

(10) Patent No.: US 10,367,133 B1
(45) Date of Patent: Jul. 30, 2019

(54) EPITAXIAL SUPERCONDUCTING DEVICES AND METHOD OF FORMING SAME

(71) Applicant: The United States of America as represented by the Director, National Security Agency, Washington, DC (US)

(72) Inventor: Charles George Tahan, Kensington, MD (US)

(73) Assignee: The United States of America, as represented by Director National Security Agency, Washington, DC (US)

(*) Notice: Subject to any disclaimer, the term of this patent is extended or adjusted under 35 U.S.C. 154(b) by 0 days.

(21) Appl. No.: 16/174,756

(22) Filed: Oct. 30, 2018

Related U.S. Application Data

(62) Division of application No. 13/999,574, filed on Aug. 12, 2014, now Pat. No. 10,147,865.

(60) Provisional application No. 61/854,263, filed on Aug. 12, 2013.

(51) Int. Cl.
| | |
|---|---|
| H01L 29/06 | (2006.01) |
| H01L 39/02 | (2006.01) |
| H01L 39/22 | (2006.01) |
| H01L 39/12 | (2006.01) |
| H01L 39/24 | (2006.01) |

(52) U.S. Cl.
CPC ............ *H01L 39/025* (2013.01); *H01L 39/12* (2013.01); *H01L 39/223* (2013.01); *H01L 39/228* (2013.01); *H01L 39/2493* (2013.01)

(58) Field of Classification Search
None
See application file for complete search history.

(56) References Cited

U.S. PATENT DOCUMENTS

| | | | |
|---|---|---|---|
| 4,145,699 | A | 3/1979 | Hu |
| 6,353,234 | B1 | 3/2002 | Faley |
| 7,061,008 | B2 | 6/2006 | Clark et al. |
| 7,547,648 | B2 | 6/2009 | Ruess et al. |
| 8,580,674 | B2 | 11/2013 | Simmons et al. |
| 8,735,326 | B2 | 5/2014 | Folk et al. |
| 2003/0042481 | A1 | 3/2003 | Tzalenchuk |
| 2009/0122940 | A1 | 5/2009 | Breed |

OTHER PUBLICATIONS

Grockowiak et al (Superconducting properties of laser annealed implanted Si:B epilayers, supercond Sci. Technol. 26(2013), pp. 1-4).*
Scappucci et al (A Complete Fabrication Route for Atomic-Sclae,Donor-Based Devices in Single-Crystal Germanium, 2011 American Chemical Society, pp. 2272-2279).*
Bustarret et al (Superconductivity in doped cubic silicon, 2006 Nature Publishing group,pp. 465-468).*

(Continued)

*Primary Examiner* — Ali Naraghi

(57) ABSTRACT

Superconducting regions formed with a crystal provide highly doped regions of acceptor atoms. These superconducting regions are used to provide superconducting devices wherein non-epitaxial interfaces have been eliminated. A method is provided to highly doped regions of a crystal to form the superconducting regions and devices. By forming the superconducting regions within the crystal non-epitaxial interfaces are eliminated.

18 Claims, 15 Drawing Sheets

(56) References Cited

OTHER PUBLICATIONS

Fuhrer, A. et al.; Atomic-Scale, All Epitaxial In-Plane Gated Donor Quantum Dot in Silicon; Nano Letters; Jan. 2009; pp. 707-710; vol. 9, No. 2; American Chemical Society; USA.
Bustarret, E. et al; Superconductivity in Doped Cubic Silicon; Nature Letters; Nov. 2006; pp. 465-468; vol. 144; Nature Publishing Group; USA.
Scappucci, G. et al.; A Complete Fabrication Route for Atomic-Scale, Donor-Based Devices in Single-Crystal Germanium; Nano Letters; May 10, 2011; pp. 2272-2279; vol. 11; American Chemical Society; USA.
Fuechsle, M. et al.; Spectroscopy of Few-Electron Single-Crystal Silicon Quantum Dots; Nature Nanotechnology; Jul. 2010; pp. 502-505; vol. 5, Macmillan Publisher Ltd.
Grockowiak, A. et al.; Superconducting Properties of Laser Annealed Implanted Si:B Epilayers; Superconductor Science and Technology; Mar. 7, 2013; pp. 1-4, vol. 26; IOP Publishing Ltd; available online at : stacks.iop.org/SUST/26/045009.

* cited by examiner

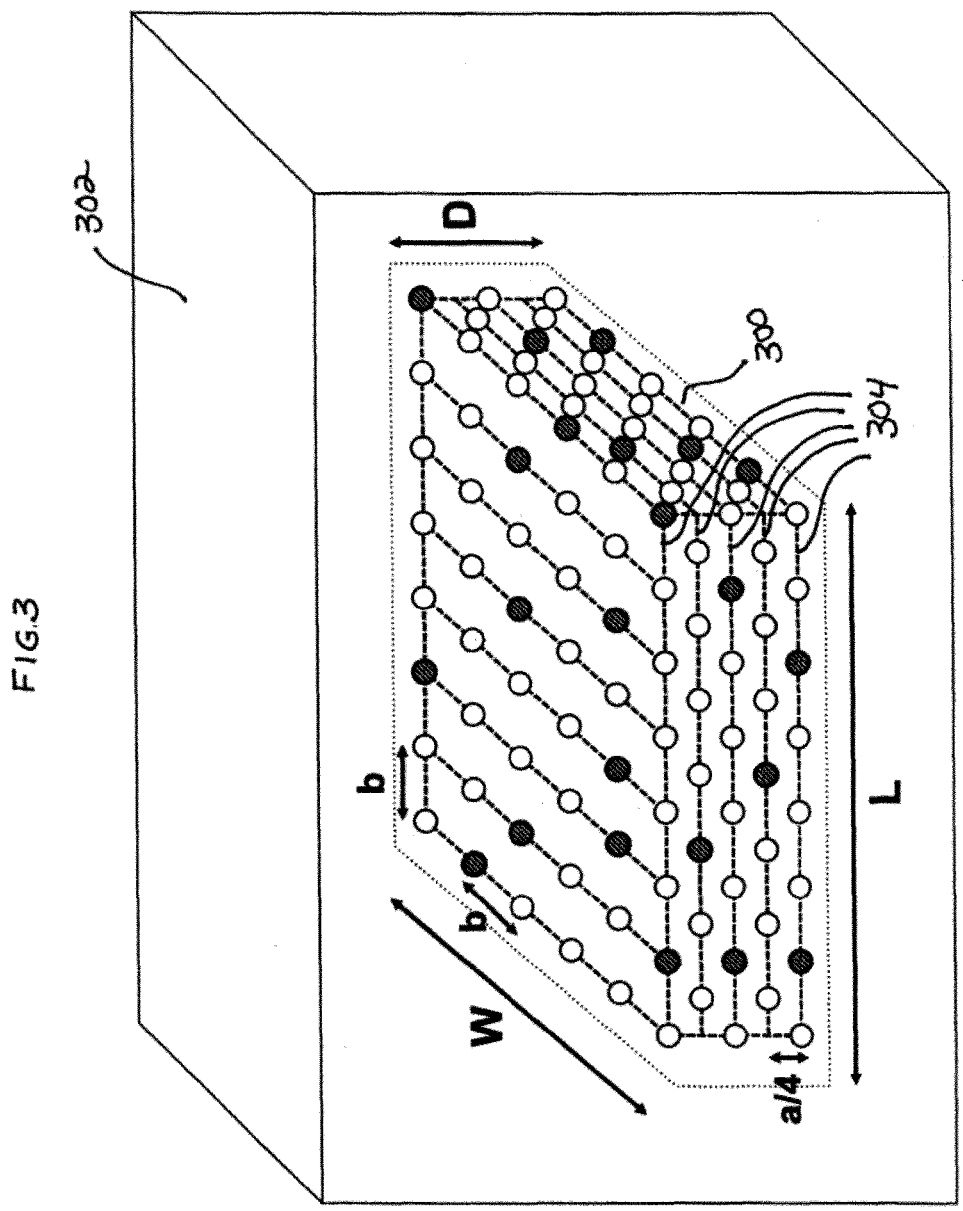

EPITAXIAL SUPERCONDUCTING DEVICES AND METHOD OF FORMING SAME

This application is a divisional of U.S. patent application Ser. No. 13/999,574, filed Aug. 12, 2014 which claims the domestic benefit of U.S. provisional patent application Ser. No. 61/854,263 filed on Aug. 12, 2013, which disclosure is hereby incorporated by reference in its entirety.

FIELD OF THE INVENTION

This invention is generally directed to superconducting devices formed from doped semiconductors and a method of forming superconducting devices from doped semiconductors.

BACKGROUND OF THE INVENTION

Superconductivity is a phenomenon of zero or near-zero electrical resistance and expulsion of magnetic fields occurring in certain materials when cooled below a characteristic critical temperature. Josephson junctions (JJ) are non-linear, loss-less circuit elements which utilize the Josephson effect and are important to superconducting technology. Superconducting wires and Josephson junctions, along with other electrical elements such as capacitors and inductors, can be combined to construct superconducting circuits. The wide spread use of the JJ follows a long history of development including the IBM Josephson digital computer program of the 1970s, which pioneered the tunneling JJ technology. This program was based primarily on Pb-alloy tunnel junctions whose applicability is limited due to the critical current spread and the instability of the Pb. Since then, Niobium/Aluminum-Oxide/Niobium ($Nb/AlO_x/Nb$) Josephson junctions and Aluminum/Aluminum-Oxide/Aluminum ($Al/AlO_x/Al$) Josephson junctions have become almost ubiquitous for superconducting devices such as superconducting qubits, logic for classical information processing, sensors such as Superconducting Quantum Interference Device (SQUID) magnetometers, and circuits used to set voltage standards. $Nb/AlO_x/Nb$ JJs proved to be more reliable and stable and have become the materials of choice in many traditional superconducting elements and devices, while $Al/AlO_x/Al$ JJs are typically preferred for quantum computing and quantum device applications at millikelvin-operating temperatures as in a dilution refrigerator.

$Nb/AlO_x/Nb$ and $Al/AlO_x/Al$ JJs are made out of heterogeneous components, i.e. they are formed from some combination of superconducting metals, insulators (such as between the two superconductors to form a tunnel barrier), oxides that form naturally on the surface of the superconductors, or the substrate in which the elements are fabricated. Similarly most superconducting elements are made out of heterogeneous components.

Josephson junctions are essential elements for many superconducting applications. Two types of Josephson junctions include the superconducting tunnel junction and the weak-link junction. Each of these Josephson junctions varies in the way the two superconducting components are connected. While the two superconducting components of a tunneling Josephson junction are divided by a tunneling barrier, in the weak-link JJ the two superconducting components are connected by a superconducting or metallic (normal metal) link.

A prior art tunneling Josephson junction 100 is illustrated in FIG. 1. As illustrated, the Josephson junction 100 includes a first superconducting component 102, a second superconducting component 104, and a tunneling barrier 106 positioned between the first and second superconducting components 102, 104. The first and second superconducting components 102, 104 are formed on a substrate 108. Given the heterogeneous components of the Josephson junction 100, a number of interfaces result. These interfaces are emphasized in FIG. 1 by using a "cross-hatched" notation. A substrate-superconductor interface 110 is provided where the superconducting components 102, 104 contact the substrate 108; a barrier interface 112 is provided where the superconducting components 102, 104 contact the barrier 106; a substrate-vacuum interface 116 is provided where the substrate 108 contacts the vacuum in which the JJ resides; and a superconductor-vacuum interface 114 is provided where the components of the Josephson junction are exposed to the vacuum within which the Josephson junction resides. Loss or noise which limits device performance can occur at each of these interfaces or within the non-superconducting materials such as the substrate 108 or the tunnel barrier 106. For example, at each of the interfaces identified, charge traps, dangling bonds, impurities, or other defects resulting from an imperfect match between the two materials can result in, for example, two-level fluctuators that can absorb electromagnetic energy (loss) or create fluctuating electromagnetic fields or unwanted quantum interactions (noise). Within the substrate or barrier material, which could be crystalline or amorphous, impurities and other defects can also cause loss and noise. At the superconductor-vacuum interface 114, a surface oxide on the metal surface often forms which can cause similar loss and noise problems.

A prior art weak link Josephson junction is illustrated in FIG. 2. As illustrated the weak link Josephson junction 200 includes a first superconducting component 202 a second superconducting component 204, and a weak link 206 positioned between the first and second superconducting components 202, 204. The first and second superconducting components 202, 204 are formed on a substrate 208 and are spaced apart by a region. The weak link 206 is positioned within this region and opposite ends of the weak link 206 respectively contact the first and second superconducting components 202, 204. The weak link 206 is formed from a normal metal region or a superconducting region where the superconductivity is weakened either by geometric constriction or by a change in the superconducting order parameter. Given the heterogeneous components of the weak link Josephson junction 200, a number of interfaces result. These interfaces are emphasized in FIG. 2 by using a "cross-hatched" notation. A substrate-superconductor interface 210 is provided where the superconducting components 202, 204 contact the substrate 208; a link interface 212 is provided where the superconducting components 202, 204 contact the link 206; a substrate-vacuum interface 216 is provided where the substrate 208 contacts the vacuum in which the JJ resides; and a superconductor-vacuum interface 214 is provided where the components of the Josephson junction 200 are exposed to the vacuum within which the Josephson junction 200 resides. Loss or noise which limits device performance can occur at each of these interfaces or within the non-superconducting materials such as the substrate 208. For example, at the substrate-superconductor interface 210 or link interface 212, charge traps, dangling bonds, impurities, or other defects resulting from an imperfect match between the two materials can result in, for example, two-level fluctuators that can absorb electromagnetic energy (loss) or create fluctuating electromagnetic fields or unwanted quantum interactions (noise). Within the substrate 208, which could be crystalline or amorphous, impurities and other defects can also cause loss and noise. At the superconductor-vacuum interface 214, a surface oxide on the metal surface often forms which can cause similar loss and noise problems.

Traditionally, the superconducting tunneling junction has been widely used due to its easier fabrication with $AlO_x$ barrier and its well-defined nonlinear current-phase relation. Weak-link junctions traditionally provide an alternative in applications requiring high Josephson critical current and/or small size junction areas. In some applications, such as for example, quantum computing or other low-power circuits, interfaces between the materials used to form the heterogeneous superconducting elements pose problems. For example, problems at the interfaces provided by these devices lead to electromagnetic loss or electromagnetic or quantum noise and subsequent poor performance of the circuits which incorporate these devices and elements. Specifically, for example in the case of heterogeneous superconducting qubits, electromagnetic loss occurs at the substrate-vacuum interface resulting in qubit coherence problems, which relates to memory and gate errors. This error limits applications in which superconducting qubits may be utilized.

Another problem with heterogeneous superconducting devices is that formation of these heterogeneous superconducting devices requires the fabrication of different materials (e.g. metals, insulators, crystals, and substrates) making fabrication more difficult.

Another problem with heterogeneous superconducting devices is that sometimes the material used limits the device which can be constructed. For example, if metal wires are to be formed, certain fabrication techniques for metals limit the minimum size for the metal wires.

The invention builds from experimental progress in four different areas. First, the list of superconducting materials has expanded to include doped covalent semiconductors, particularly silicon (Si) and germanium (Ge). These techniques provide for heavily doping the semiconductor material with acceptors, for example Boron (B), in bulk or thin-film samples. By doping a semiconductor or an insulator above the metal-insulator transition density, the host material can turn into a superconductor below a critical temperature and magnetic field. Superconductivity has been observed in many materials including hole-doped, group-IV materials such as diamond, silicon and germanium. Various methods, such as high-pressure high-temperature treatments and growth using chemical vapor deposition (CVD) for C:B, gas-immersion laser doping (GILD) for Si:B, and ion implantation and annealing for Si:Ga and Ge:Ga were used to achieve very high hole densities required for superconductivity.

A second area of progress is in precise doping techniques resulting in the ability to form single atom thick sheets of impurities, single atom-wide wires, a single phosphorus atom at precise atomic locations within a crystal, and single atom-depth and/or single-atom wide wires on different vertical planes of a crystal. For example, scanning tunneling microscope (STM) lithography together with atomic layer doping has been used to achieve very high, atomically precise doping of the donor phosphorous (P) in Si and Ge.

A third area of development provides for the formation of spin qubits in silicon. This development provides that a single electron or hole spin is attached to single donor or trapped in a quantum dot in isotopically enriched and chemically purified silicon. These spin qubits have been demonstrated to have very good coherence properties, and therefore are widely considered to be leading candidates for fault-tolerant quantum computing.

Fourth, the development of superconducting circuit technology resulting in a large design space of superconducting qubit approaches and approaches for low-powered superconducting Josephson junction based logic, sensors, and other superconducting devices.

SUMMARY OF THE INVENTION

Briefly, the present invention discloses superconducting regions formed by doping semiconductors. These superconducting regions are used to form superconducting devices. The superconducting regions are formed epitaxially, thereby eliminating unwanted interfaces which are present in prior art superconducting devices. The present invention also discloses a method for forming the superconducting regions and devices of the present invention.

BRIEF DESCRIPTION OF THE DRAWINGS

The organization and manner of the structure and operation of the invention, together with objects and advantages thereof, may best be understood by reference to the following description, taken in connection with the accompanying drawings, wherein like reference numerals identify like elements in which:

FIG. 3 is a perspective view of the superconducting region of the present invention within a crystal;

DETAILED DESCRIPTION OF THE PREFERRED EMBODIMENT

Figure 1:
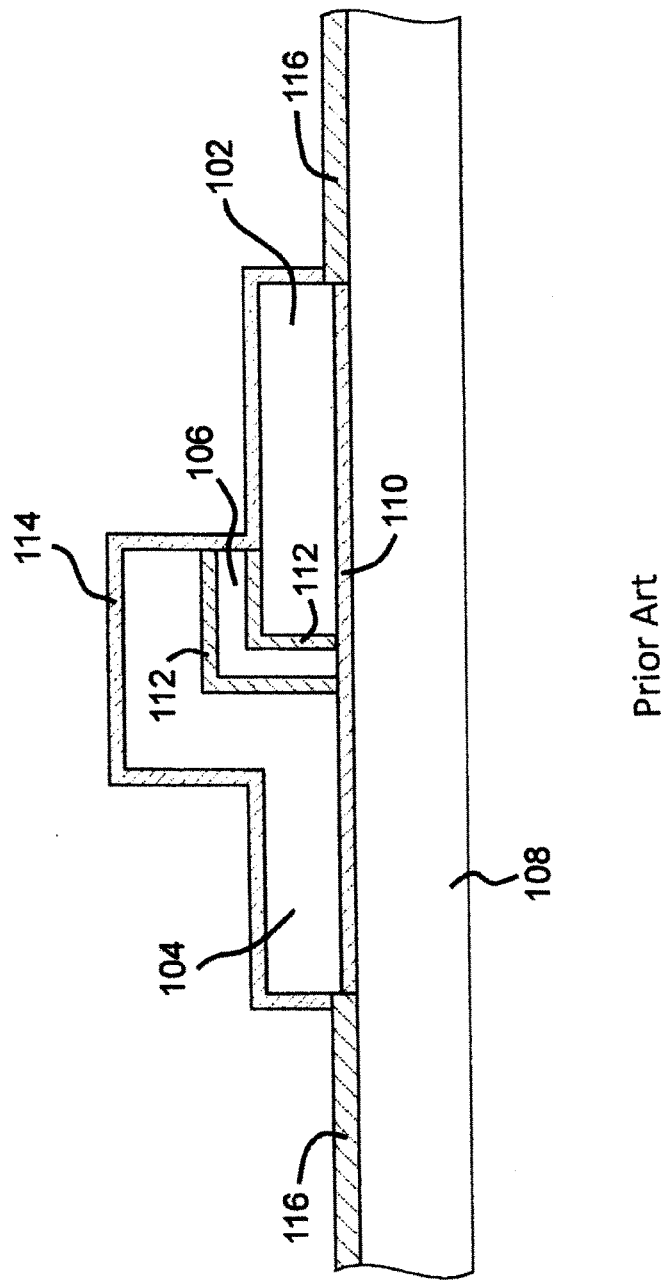
FIG. 1 is a cross-sectional view of a prior art superconducting tunneling Josephson junction, with non-epitaxial interfaces of the device emphasized.
Figure 2:
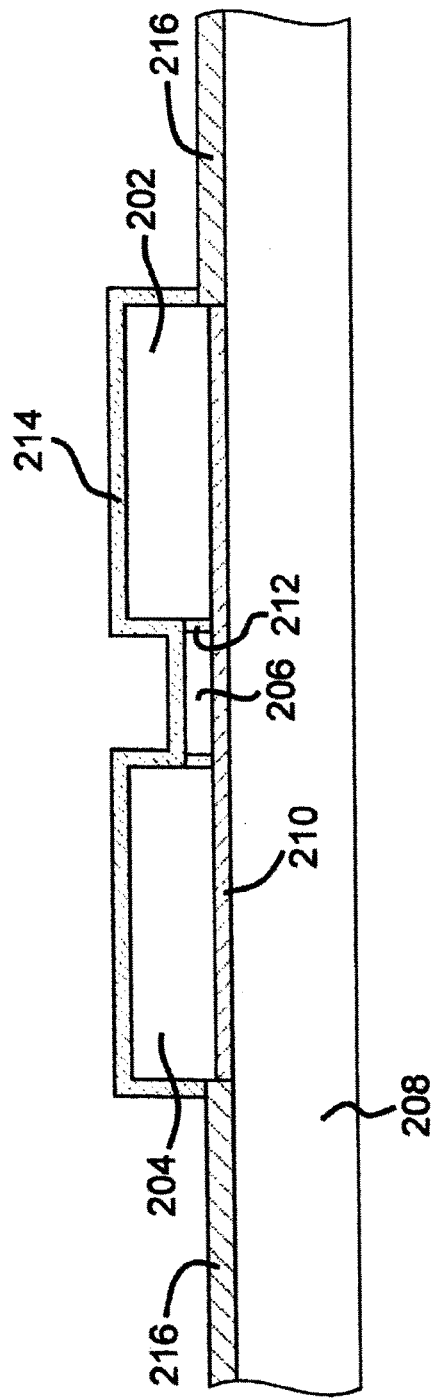
FIG. 2 is a cross-sectional view of a prior art superconducting weak link Josephson junction, with non-epitaxial interfaces of the device emphasized.

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein.

The invention replaces the interfaces and junction materials of the prior art with crystal which is highly perfect, isotopically enriched, and/or chemically purified.

The invention provides superconducting elements and devices formed from and contained within an ultra-clean semiconductor allowing the deleterious effects of interfaces and amorphous materials to be minimized.

A superconducting wire 300 of the present invention is illustrated in FIG. 3. The superconducting wire 300 is epitaxially grown, i.e. the wire 300 is formed within a semiconductor crystal 302. The semiconductor crystal 302, may be, for example, silicon (Si). The superconducting wire 300 is positioned remotely from any noisy interfaces or surfaces where other materials may also be present. As described below, monolayers of the semiconductor are "grown" to form the crystal 302.

As the crystal 302 is formed, a selected region of certain selected monolayers is heavily doped to form the wire 300. The monolayers are hole doped to sufficient acceptor density to allow the wire 300 to function as a superconductor. The wire 300 provides a length, L, a width, W, and a depth, D. The wire includes a total number of monolayers, $N_1^{tot}$, in the vertical direction. As illustrated in FIG. 3, the wire 300 includes five monolayers 304. After the monolayer 304 of the crystal 302 is formed, each kth layer is doped at a rate of $r_D$. For example, the crystal 302 is selected to be silicon, Si. As the monolayers 304 of silicon were formed, the monolayers were doped with the dopant boron (B). Silicon atoms are illustrated in FIG. 3 as open circles and boron atoms are illustrated in FIG. 3 as shaded circles. The wire 300 shows all monolayers are doped. Dopant atoms are therefore provided in each monolayer 304 of the wire 300. Thus, k=1. The depth of the wire is provided by D=(a/4)(N$_1$-1)k, where a represents the lattice constant of the crystal; N$_1$ represents the number of monolayers which have been doped; and k represents the frequency with which the monolayers are doped. If, for example, each layer is doped, k=1; if every other layer is doped, k=2; and if every third layer is doped, k=3. The total number of monolayers in the wire is provided by:

$$N_1^{tot} = ((N_1-1)k)+1.$$

The total number of dopants $N_D$ is given by:

$$N_D = \left(\frac{W}{b}+1\right)\left(\frac{L}{b}+1\right)r_D N_l$$

where b=a/$\sqrt{2}$=3.84 Å. Where b represents the distance between neighboring crystal sites in a single monolayer (oriented along <001>). The lattice constant of Si is 5.43 Å, thus a=5.43 Å. To estimate hole density, the finite range of holes must be accounted for. It is known that for phosphorus (P) dopants, which have a Bohr radius of 2.5 nm, the diameter of the effective electron density region, $d_B$, ranges from 1 to 2 nm. An isolated B dopant in Si has a Bohr radius of 1.6 nm. Thus, the diameter of the effective electron density is selected to be 1 nm, i.e. $d_B$=1 nm. Assuming all B dopants are activated, the hole density $n_h$ is given by:

$n_h = N_D/[(W+d_B)(L+d_B)(D+d_B)]$. For W and L much larger than $d_B$, the calculation of hole density is simplified as:

$$n_h = (r_D N_l / b^2) / [(a/4)(N_l - 1)k + d_B].$$

If the density of the dopant, B, in a monolayer can reach the same level as the density of the dopant, P in Si (~25 at .%), the hole density of a single doped monolayer is $1.7 \times 10^{21}$ cm$^{-3}$, which is above the critical hole density for superconductivity. In this case, using the experimentally observed density dependence of the critical temperature, $T_c=C(c_B/c_c-1)^{0.5}$, where C represents a materials specific constant determined by experiment, $c_B$ represents the density of B, and $c_c$ represents the minimum critical density for superconductivity. With C≈0.35, $T_c$ is calculated to be $T_c$~0.3K in this case. The acceptor dopant described in this example is Boron, however it is to be understood that the acceptor dopant used could be any acceptor selected from Group III acceptors. Other examples include Aluminum (Al) and Galium (Ga). The maximum hole density is achieved for a thick doped region (D>>$d_B$) with every layer being doped (k=1). For $r_D$=25 at .%, $n_h$=1/ab$^2$=1.25×10$^{22}$ cm$^{-3}$ (a few times more than the highest density obtained by laser doping), we get a maximum $T_c$≈1.2K, which is comparable to the critical temperature of aluminum (Al), a metallic superconductor.

Figure 4A:
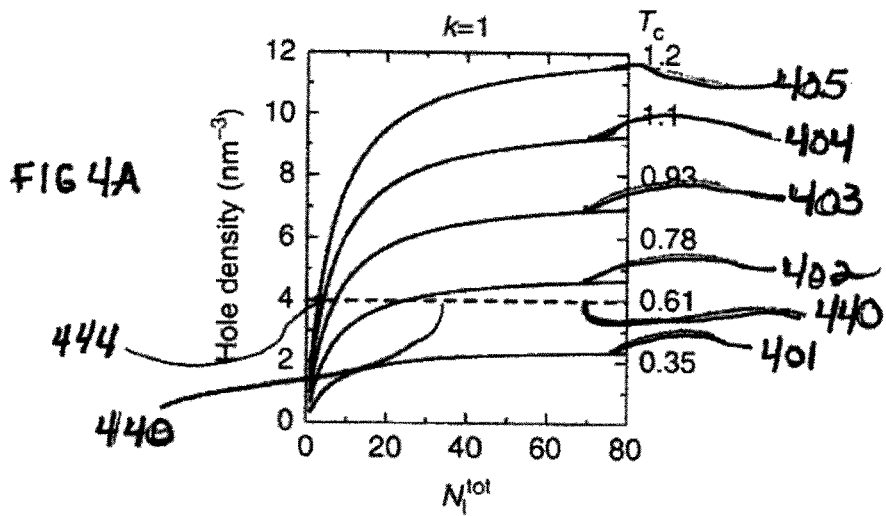
FIGS. 4A-4C are graphs containing plots illustrating hole density of the superconducting region of the present invention as a function of the total number of monolayers in the superconducting region.
Figure 4B:
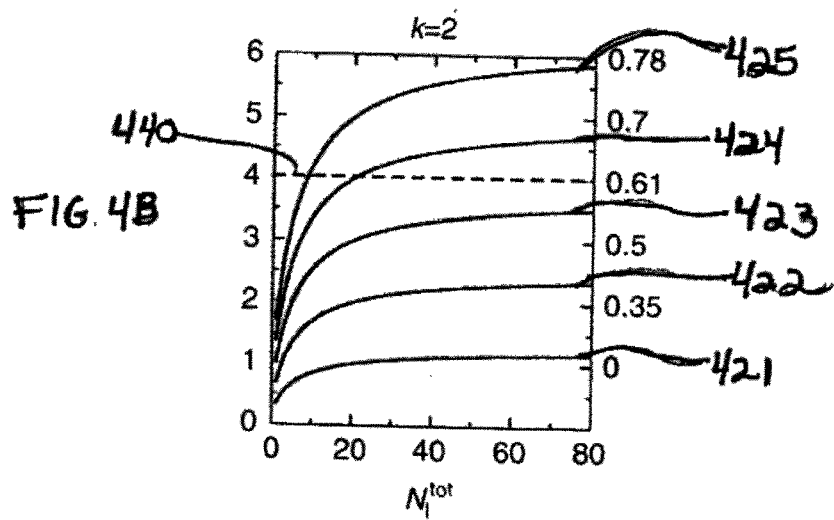
Figure 4C:
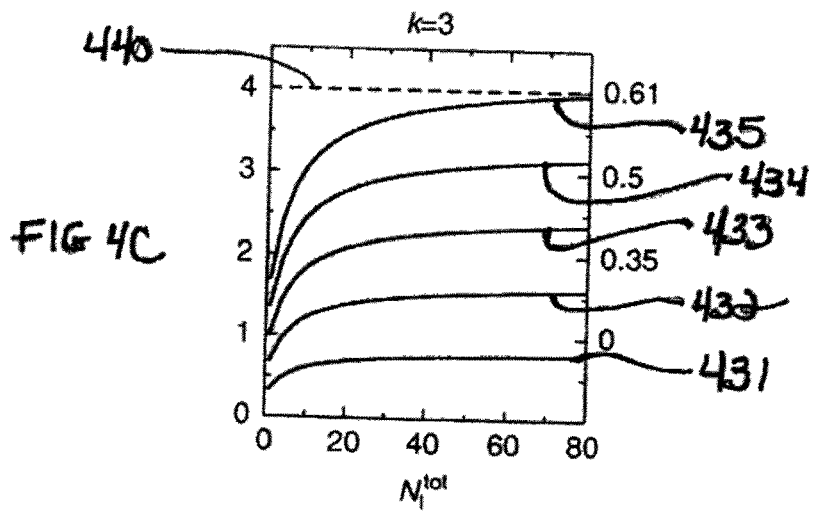

FIGS. 4a-c provide plots illustrating hole density as a function of the total number of monolayers of the wire, $N_1^{tot}$. Specifically, FIG. 4a includes a plurality of plots (401-405) illustrating hole density as a function of the total number of monolayers in the wire, $N_1^{tot}$, when every layer has been doped (i.e., k=1); FIG. 4b includes a plurality of plots (421-425) illustrating hole density as a function of the total number of monolayers in the wire, $N_1^{tot}$, when every other layer of the wire has been doped (i.e., k=2); and FIG. 4c includes a plurality of plots (431-435) illustrating hole density as a function of the total number of monolayers in the wire, $N_1^{tot}$, when every third layer of the wire has been doped (i.e., k=3). Further, each plot relates to a specific doping rate at .%; i.e. plot 401 relates to a doping rate, $r_D$=5; plot 402 relates to a doping rate, $r_D$=10; plot 403 relates to a doping rate, $r_D$=15; plot 404 relates to a doping rate, $r_D$=20; and plot 405 relates to a doping rate, $r_D$=25. Similarly the plots of FIG. 4b and FIG. 4c include plots for the same doping rates illustrated in FIG. 4a. The critical temperature, $T_c$, is provided on the right side of each plot. A dashed line 440 representing the highest observed critical temperature ($T_c$=0.61K) for boron in silicon (Si:B) is illustrated in each of FIGS. 4a, 4b, and 4c. Point 444 on plot 405 is located at the intersection of plot 405 with the observed critical temperature. At point 444, $N_1^{tot}$=3. Thus, if each layer is maximally doped (25 at .%) for k=1, a minimum depth of the monolayer D=a/2=0.27 nm, and the hole layer D+$d_B$=1.27 nm; to reach the critical temperature $T_c$=0.61K, at least three doped layers are required. The hole density strongly depends on the depth, for small D (that is, small $N_1$) and saturates to $4r_D/(kab^2)$ for large D. For thin superconducting wires, a cross-sectional area larger than $10^3$ nm$^2$ is preferable (that is, W, D>≈30 nm) to prevent quantum phase slips. Thus, utilizing the relationships identified above, one can determine the minimum number of layers necessary to reach the desired superconducting critical temperature, $T_c$, given the experimentally available doping rate per layer, $r_D$, and the ability to dope every k-th layer.

Unlike the prior art superconducting wires, the wire 300 is formed epitaxially. The only interface provided is an epitaxial interface between the wire 300 and the crystal 302; i.e., no non-epitaxial interfaces are provided. Specifically, no substrate-superconducting interface is provided and no substrate-vacuum interface is provided. In addition, because the superconducting wire 300 is positioned entirely within the crystal 302, no superconductor-vacuum interface is found. Also, the transition region between the superconducting region and the pure crystal region can be made abrupt potentially down to one monolayer if desired unlike in the prior art.

Figure 5:
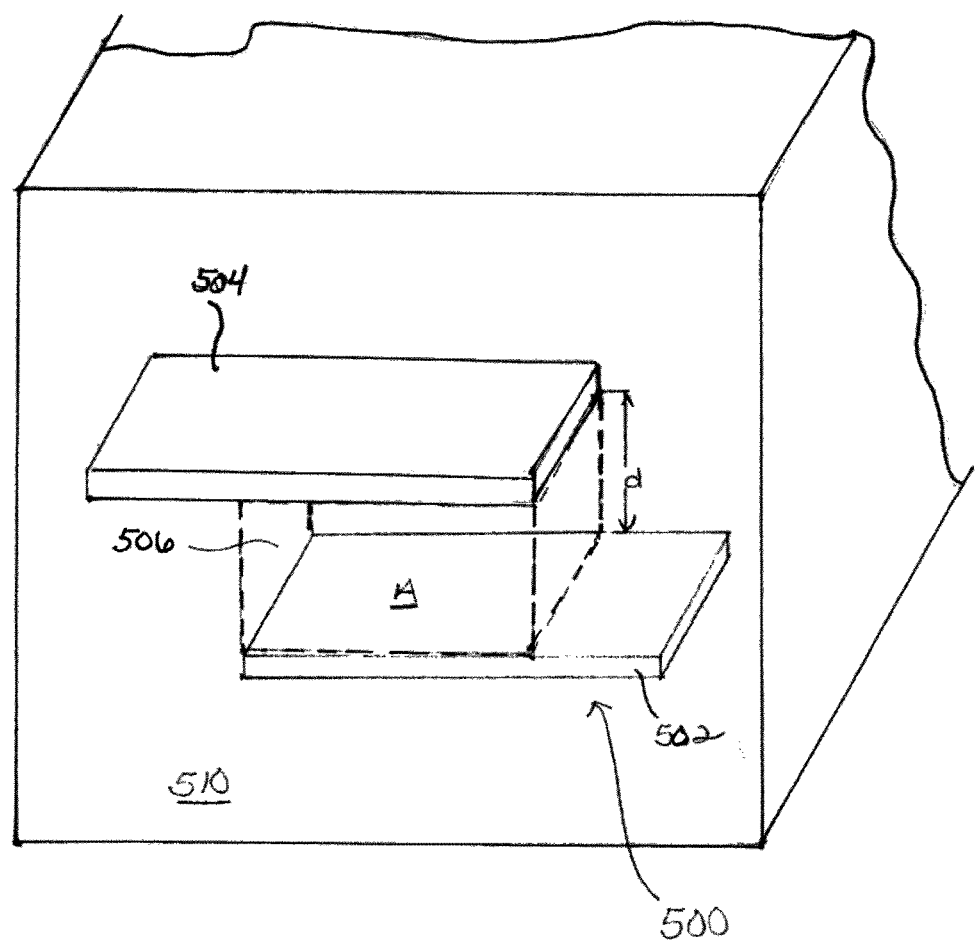
FIG. 5 is a perspective view of a tunneling Josephson junction of the present invention within a crystal.

As noted above, Josephson junctions (JJs) are an essential ingredient for many superconducting activities. Josephson junctions of the present invention are illustrated in FIGS. 5-8. A superconducting tunneling Josephson junction (STJ) 500 is illustrated in FIG. 5. The STJ 500 includes a first superconducting region 502, a second superconducting region 504, and a tunneling barrier generally provided in the overlapping region 506 defined by overlapping portions of the first and second superconducting regions 502, 504. The first and superconducting regions 502, 504 are spaced from one another by a distance, d, a parallel-plate area, A is defined by the area of each of the superconducting regions 502, 504 defined by the overlapping region 506. The STJ 500 is formed with a crystal 510 and is encapsulated within the crystal 510.

Figure 6:
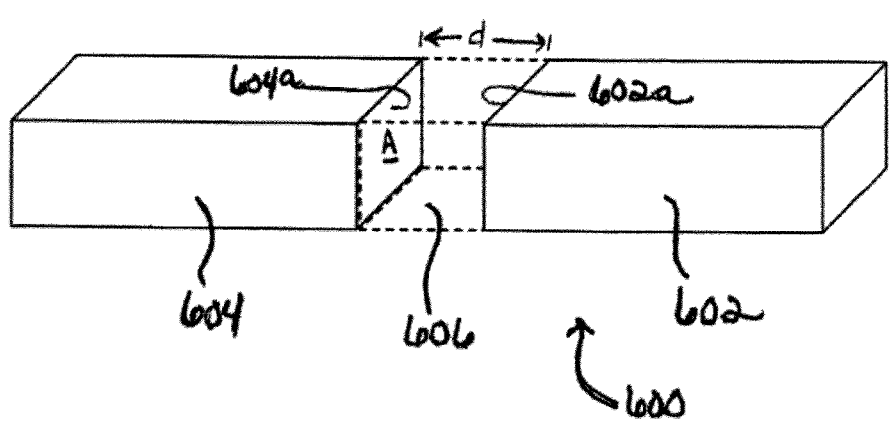
FIG. 6 is a perspective view of a tunneling Josephson junction of the present invention with the crystal removed for illustration purposes.

An alternate design for a STJ 600 is illustrated in FIG. 6, the STJ 600 includes a first superconducting region 602, a second superconducting region 604, and a tunneling barrier generally provided in the region 606 positioned between an end surface 602a of the first superconducting region 602 and an end surface 604a of the second superconducting region 604. The first and second superconducting regions 602, 604 are co-planar with a parallel-plate area, A defined by the end surfaces 602a, 604a, and are spaced from one another by a distance, d. Similar to the STJ 500, the STJ 600 is formed with a crystal and is encapsulated within that crystal. For simplification of the drawings, the crystal encapsulating the STJ 600 is not shown.

Figure 7:
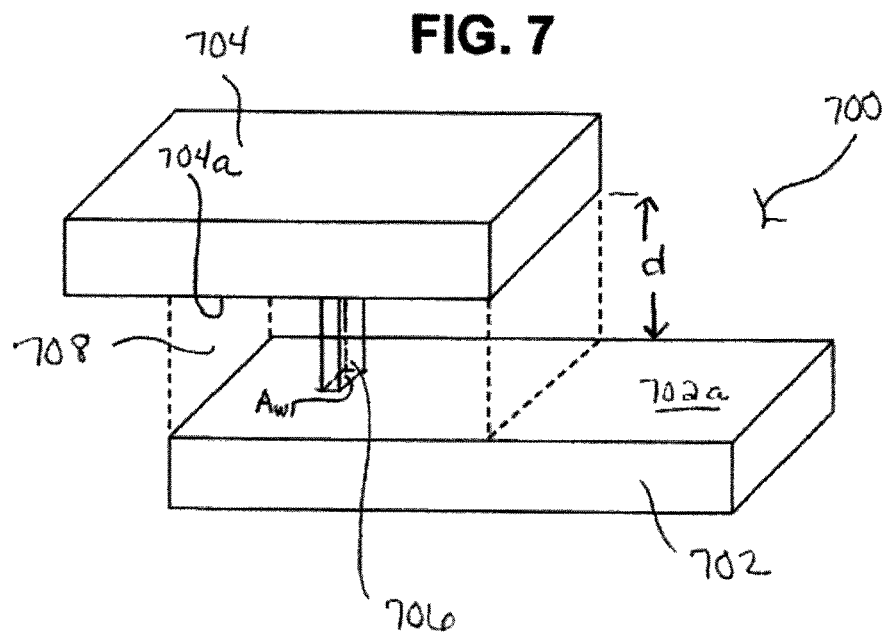
FIG. 7 is a perspective view of a weak link Josephson junction of the present invention with the crystal removed for illustration purposes.

A weak link superconducting Josephson junction 700 is illustrated in FIG. 7. The weak link JJ 700 includes a first superconducting region 702, and a second superconducting region 704. The first and second superconducting regions 702, 704 are spaced from one another by a distance, d. An overlapping region 708 is defined by overlapping portions of the first and second superconducting regions 702, 704. A link 706 is provided within the overlapping region 708 and extends between facing surfaces 702a, 704a of the first and second superconducting regions 702, 704. An area of the weak link 706, $A_{wl}$, contacts surface 702a of the first superconducting region 702 and an area of the weak link 706, $A_{wl}$, contacts surface 704a of the second superconducting region 704 (not shown). Similar to the STJ 500, the weak link JJ 700 is formed with a crystal illustrating and is encapsulated within that crystal. For simplification of the drawings, the crystal encapsulating the weak link JJ is not shown.

Figure 8:
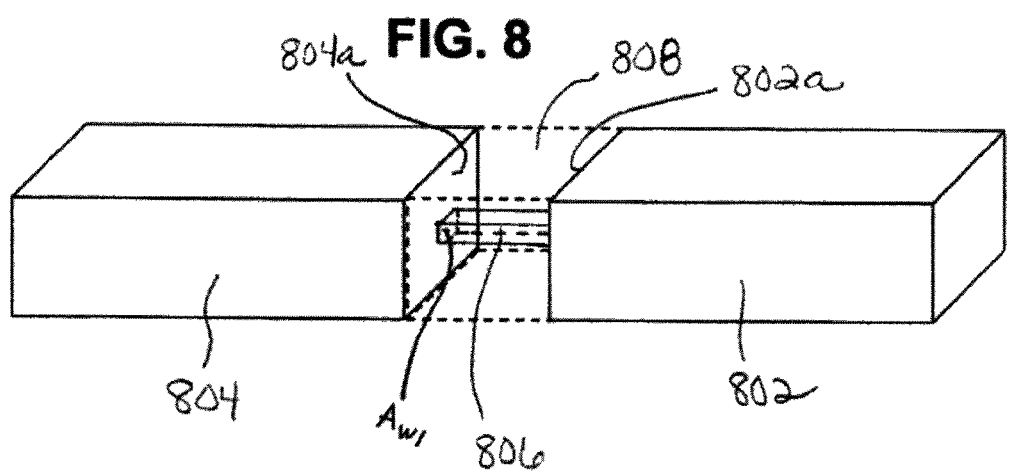
FIG. 8 is a perspective view of a weak link Josephson junction of the present invention with the crystal removed for illustration purposes.

An alternate design for a weak link superconducting Josephson junction 800 is illustrated in FIG. 8, the weak link JJ 800 includes a first superconducting region 802 and a second superconducting region 804. The first and second superconducting regions 802, 804 are co-planar and are spaced from one another by a distance, d. A link 806 is provided in the region 806 positioned between an end surface 802a of the first superconducting region 802 and an end surface 804a of the second superconducting region 804. A cross-sectional area of the weak link 806, $A_{wl}$, (not shown) contacts surface 802a of the first superconducting electrode 802 and an area of the weak link 806, $A_{wl}$, contacts surface 804a of the second superconducting electrode 804. Similar to the STJ 500, the weak link JJ 800 is formed with a crystal and is encapsulated within that crystal. For simplification of the drawings, the crystal encapsulating the weak link JJ 800 is not shown.

As will be described below, each of the Josephson junctions illustrated in FIGS. 5-8 is formed by growing a crystal and doping selected areas of monolayers, as the crystal is grown, for doping with an impurity as will be described below. Because the JJs are formed from doped regions of the same crystal as the crystal is grown, the elements are homogenous. Unlike the prior art JJs, the JJs 500, 600, 700 and 800 are formed epitaxially. Thus, the only interfaces provided by these JJs are epitaxial interfaces; i.e., no non-epitaxial interfaces are provided. Specifically, the non-epitaxial substrate-superconducting interface is eliminated, the non-epitaxial barrier interface is eliminated; the non-epitaxial substrate-vacuum interface is eliminated; and the non-epitaxial superconductor-vacuum interface is eliminated. By selecting the dimensions of the crystal, the JJs can be constructed well away from any interfaces. The homogeneous system, therefore, results in the elimination of interfaces and the negative effects (such as e.g., loss or noise) resulting from such interfaces.

Figure 12:
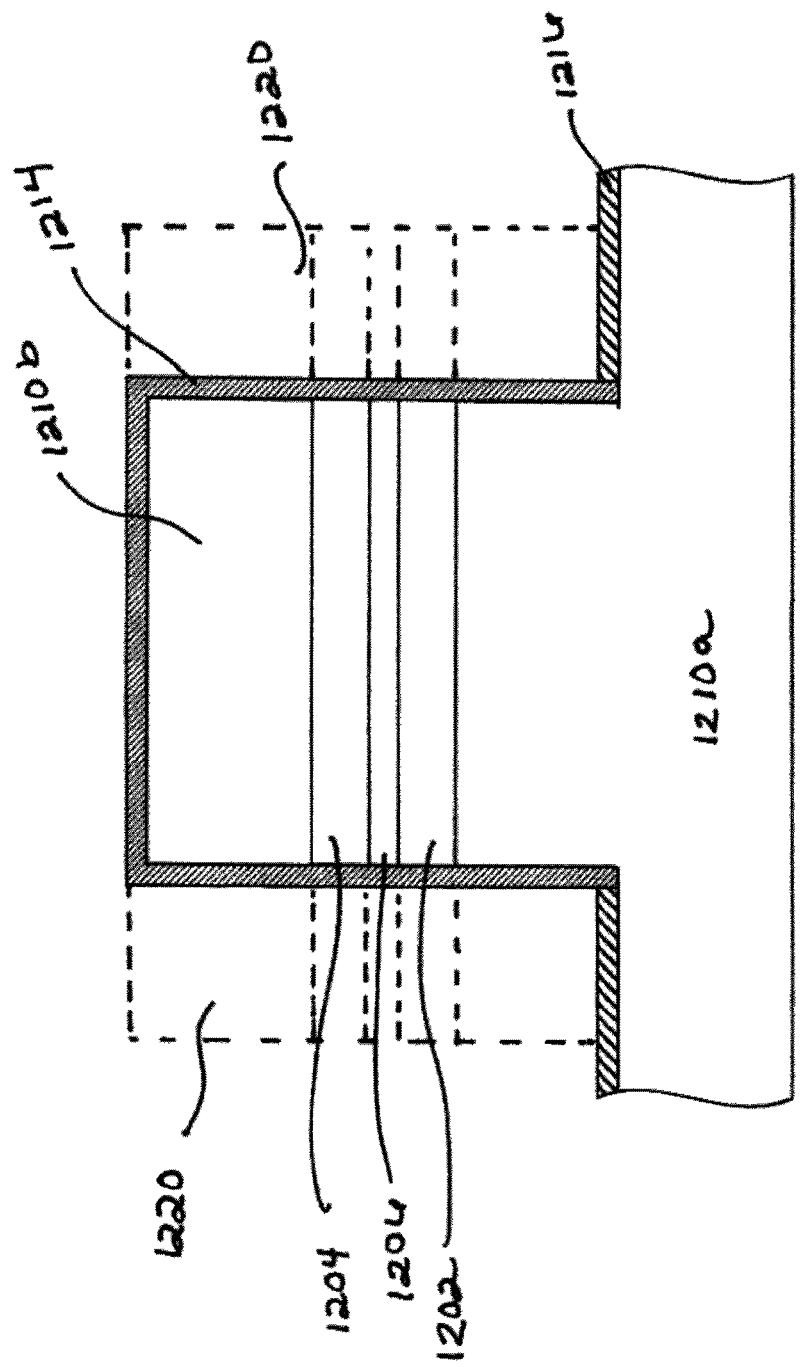
FIG. 12 is a cross sectional view of a superconducting device of the present invention including non-epitaxial interfaces.

As noted above, the superconducting JJs illustrated in FIGS. 5-8 do not provide any non-epitaxial interfaces. In some instances, it is not critical to eliminate all non-epitaxial interfaces. FIG. 12 illustrates a tunneling JJ 1200 in which some of the non-epitaxial interfaces have been eliminated and others remain. The tunneling JJ 1200 is grown on a lower portion 1210a of a crystal. The tunneling JJ includes a first superconducting region 1202 and a second superconducting region 1204. A tunneling barrier 1206 is provided between the first and second super conducting regions 1202, 1204. An upper portion 1210b of the crystal is provided above the second superconducting region 1204. Because the superconducting region 1202 is formed with the crystal, the non-epitaxial substrate-superconducting interface found in prior art JJs is eliminated. Likewise, because the barrier 1206 and the second superconducting region 1210 are formed with the crystal, the non-epitaxial barrier interface is eliminated. Unlike the superconducting JJs of FIG. 5-FIG. 8, however, as will be described below, an etching process is used to define some of the dimensions of the JJ 1200. As a result, a non-epitaxial substrate-vacuum interface 1216 is provided where the crystal 1210a contacts the vacuum in which the JJ resides and a non-epitaxial superconductor-vacuum interface 1214 is provided where the components of the Josephson junction are exposed to the vacuum within which the Josephson junction resides.

In order to function appropriately, the dimension of the components of the tunneling JJs must be determined. The tunneling superconducting JJ may be, for example, an overlapping JJ as illustrated in FIG. 5 or a co-planar JJ as illustrated in FIG. 6.

Two energy scales that characterize a Josephson junction are the charging energy scale, $E_C$, and the junction energy scale, $E_J$. The charging energy scale $E_C$ is provided by $E_C=(2e)^2/2C_J$, where $C_J$ represents the junction capacitance and e represents the elementary charge. The junction energy scale $E_J$ is provided by $E_J=\hbar I_c/2e$, where $I_c$ is the critical current (maximum d.c. Josephson current), and $\hbar$ represents Planck's constant divided by $2\pi$. For the capacitance $C_J=\varepsilon_r\varepsilon_0$ A/d with $\varepsilon_r\approx 12$ for Si, the charging energy is given by $E_c=3.0$ eV nm×d/A. For the superconducting tunneling junction, the relationship between the critical current, $I_c$, and the normal resistance (i.e. the resistance of the junction in the normal state), $R_n$, is provided by $I_cR_n=(\pi\Delta)/(2e)$ tanh$(\Delta/2k_BT)$. Here, $\Delta$ is the superconducting energy gap, $k_B$ is Boltzmann's constant and T is the temperature. At zero temperature, this equation reduces to $I_cR_n=\pi\Delta(0)/2e$. Thus, the junction energy of the superconducting tunneling junction at zero temperature is provided by $E_J=0.29$ eV$\Omega\times(1/R_n)$ for Si in this case.

The normal resistance, $R_n$, of the superconducting tunneling junction can be estimated by first assuming a square potential barrier of size, d, and tunneling barrier height $V_b=E_g/2+\varepsilon_F$ where $E_g$ is the energy gap of Si and $\varepsilon_F$ is the Fermi energy of the holes for a given density. Then, the tunneling conductance, G, per unit area is given by:

$$G/A = \frac{m_h e^2}{2\pi^2\hbar^3}\int_0^{\varepsilon_F} d\varepsilon_z T(\varepsilon_z);$$

where $m_h$ represents the effective mass of the hole, and $T(\varepsilon_z)$ is the transmission coefficient function, given by:

$$T(\varepsilon_z) = 4\varepsilon_z(V_b-\varepsilon_z)/[4\varepsilon_z(V_b-\varepsilon_z)+V_b^2\sinh^2 kd]$$

and $k=\sqrt{(V_b-\varepsilon_z)2m_h/\hbar^2}$. The tunneling resistance is provided by $R_n=1/G$. Utilizing the assumption that the hole effective mass $m_h=0.5$ $m_e$, the tunneling resistance is calculated as $R_n\approx 10^4 e^{5.6d}/A$ in units of $\Omega$s, where:

d is provided in units of nm; and
A is provided in units of $nm^2$.

The barrier height, $V_b$, is provided by $V_b=E_g/2+\varepsilon_F$; where:
$E_g$ is the energy gap; and
$\varepsilon_F$ is the Fermi energy of holes.

Thus, for a tunneling Josephson junction formed from Si, $V_b\approx 2.4$ eV. The Fermi energy obtained by using the effective mass at low density is overestimated relative to the actual effective Fermi energy of high-density holes, but the barrier height $V_b$ and shape can be significantly modified by changing the electrostatic environment surrounding the Junction, for example by changing the potential on a nearby metallic gate (which itself could be made of metal or a doped region of the crystal) as will be described below.

Figure 9:
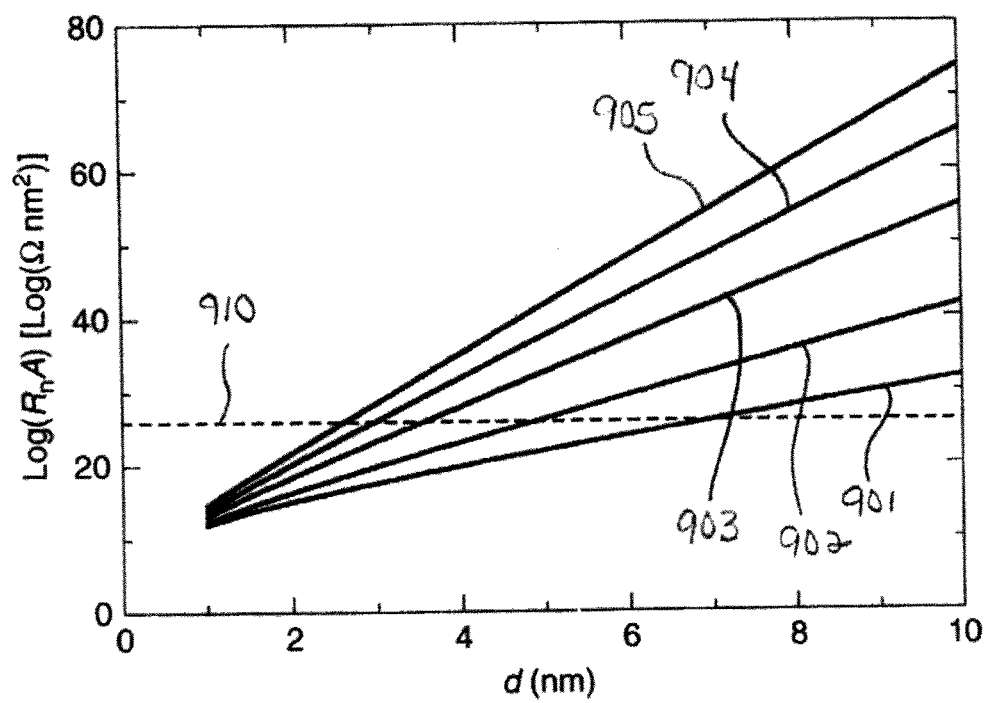
FIG. 9 is graph containing plots of the tunneling resistance as a function of the barrier depth, d, for various barrier heights.

The resistance of the barrier can be changed by varying its depth and/or barrier height. As illustrated in FIG. 9, plots 901-905 provide the tunneling resistance as a function of the barrier depth, d, for various barrier heights. The hole density for each plot is selected to be $n_h=4\times 10^{21}$ $cm^{-3}$ which corresponds to the maximum hole density achieved for $T_c=0.6$ K in previous experiments. Each plot 901-905 relates to a barrier height, $V_b$. Plot 901 relates to a barrier height $V_b=2.6$ eV; plot 902 relates to a barrier height $V_b=2.4$ eV; plot 903 relates to a barrier height $V_b=2.2$ eV; plot 904 relates to a barrier height $V_b=2.0$ eV; and plot 905 relates to a barrier height $V_b=1.9$ eV. A horizontal dashed line 910 indicates a tunneling resistance corresponding to $V_b=2.4$ eV and d=3 nm. FIG. 9 illustrates, therefore, that $R_n$ is proportional to $e^{\alpha d}/A$ for some constant, $\alpha$. Thus, by tuning the barrier height, the depth of the barrier may be varied. For example, if the barrier height is lowered, the requirement on the necessary thinness of the barrier may be relaxed. For example, if d≤3 nm is required to obtain large enough tunneling current for $V_b=E_g/2+\varepsilon_F\approx 2.4$ eV, then by decreasing the barrier height to $V_b\approx 1.9$ eV, the requirement for the barrier width, d, is provided by d≤7 nm.

Figure 10:
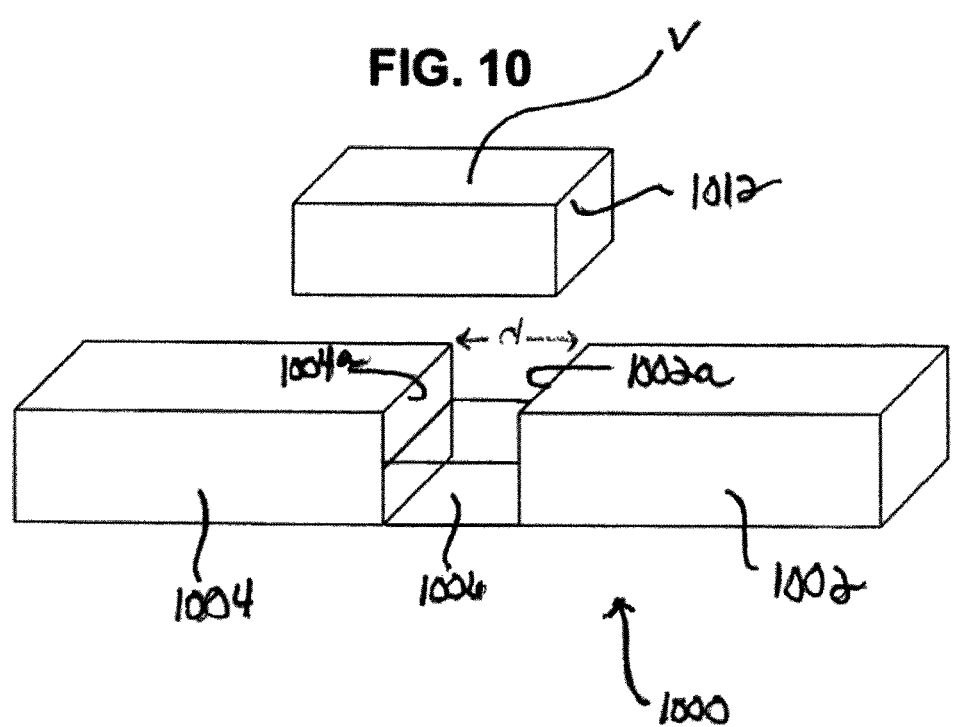
FIG. 10 is a perspective view of a tunneling Josephson junction of the present invention, including a crystal surface mounted gate, with the crystal removed for illustration purposes.

To overcome thermal fluctuations, it has been found that the junction energy must be much larger than the operating temperature. In practice, $E_J\geq 5k_BT\approx 4.3$ μeV for 10 mK. The barrier distance, d, of the superconducting tunneling junction then must satisfy d≤3 nm for A=1 $\mu m^2$. The junction area A cannot be much smaller since then the distance d would need to be very small. Because it may be easier to dope a thin layer with large surface area than it is to dope a thicker layer with a smaller surface area, a large junction area is more easily implemented. If however, it is desired to keep the junction area small, while relaxing the requirement regarding the barrier distance, d, an external gate provided by a separate doped region can be utilized to control the requirements regarding the tunneling barrier height and shape as is shown in FIG. 10. Thus, the restrictions regarding barrier distance and area may be relaxed at the expense of a more complicated device design.

For the weak link superconducting junction such as the junctions illustrated in FIGS. 7 and 8, the above relationship, i.e. $I_cR_n=(\pi\Delta)/(2e)$ tanh$(\Delta/2k_BT)$, holds true when the temperature, T, is near the critical temperature, $T_c$, however, when T=0, $I_cR_n=1.32\pi\Delta(0)/2e$ is in the dirty superconductor limit. For the weak link superconducting junction illustrated in FIG. 7, the critical current, $I_c$, is determined by the cross-sectional area, $A_{wl}$, of the link 706 and the length, of the link 706 defined by the distance, d. The capacitance, C, is determined by the cross-sectional area of the overlapping 708 and the distance, d. The weak link JJ illustrated in FIG. 7 is suitable when a large overlapping region 708 (small charging energy $E_c$) is required. The weak link JJ illustrated in FIG. 8 is suitable if a large overlapping area (large capacitance) is not required. The junction energy at zero temperature for the weak link is provided by:

$E_J=0.39$ eV$\Omega\times(1/R_n)$.

The normal resistance $R_n$ of the weak link junction is provided by:

$\rho_n=d/A_{wl}$; where $\rho_n=10^3$ $\Omega$nm, wherein $\rho_n$ is the resistivity in the weak link region. To overcome thermal fluctuations, it is required that $A_{wl}/d\geq 0.01$ nm for the weak link. This requirement is easily satisfied, and the junction energy is independent of the total junction area A.

A JJ utilizing an external gate is illustrated in FIG. 10. The JJ 1000 includes a first superconducting region 1002, a second superconducting region 1004, and a junction 1006 generally provided in the region positioned between an end surface 1002a of the first superconducting region 1002 and an end surface 1004a of the second superconducting region 1004. The JJ illustrated in FIG. 10 represents either a tunneling junction or a weak link junction. The first and second superconducting regions 1002, 1004 are co-planar and are spaced from one another by a distance, d. The JJ 1000 is formed within a crystal not illustrated. A gate 1012 is formed on the surface of the crystal. The gate 1012 is formed from a superconducting metal, a normal metal, a superconducting doped semiconductor region, or a normal metal doped semiconductor region. The gate is used to control the density (superconducting order parameter or superconducting gap) or the barrier height of the junction region by either changing the density of carriers in the junction region or by application of an electric field, V, to the region. Although the gate 1012 of the JJ 1000 is formed on the surface of the crystal, it is to be understood that the gate 1012 could be formed within the crystal (not shown).

It is noted that although the first and second superconducting regions, such as those illustrated on FIGS. 5-8,10, 12, 13, 14 and 15, are described as two separate regions, in fact one region could be utilized to provide the first and second conducting regions.

Figure 11:
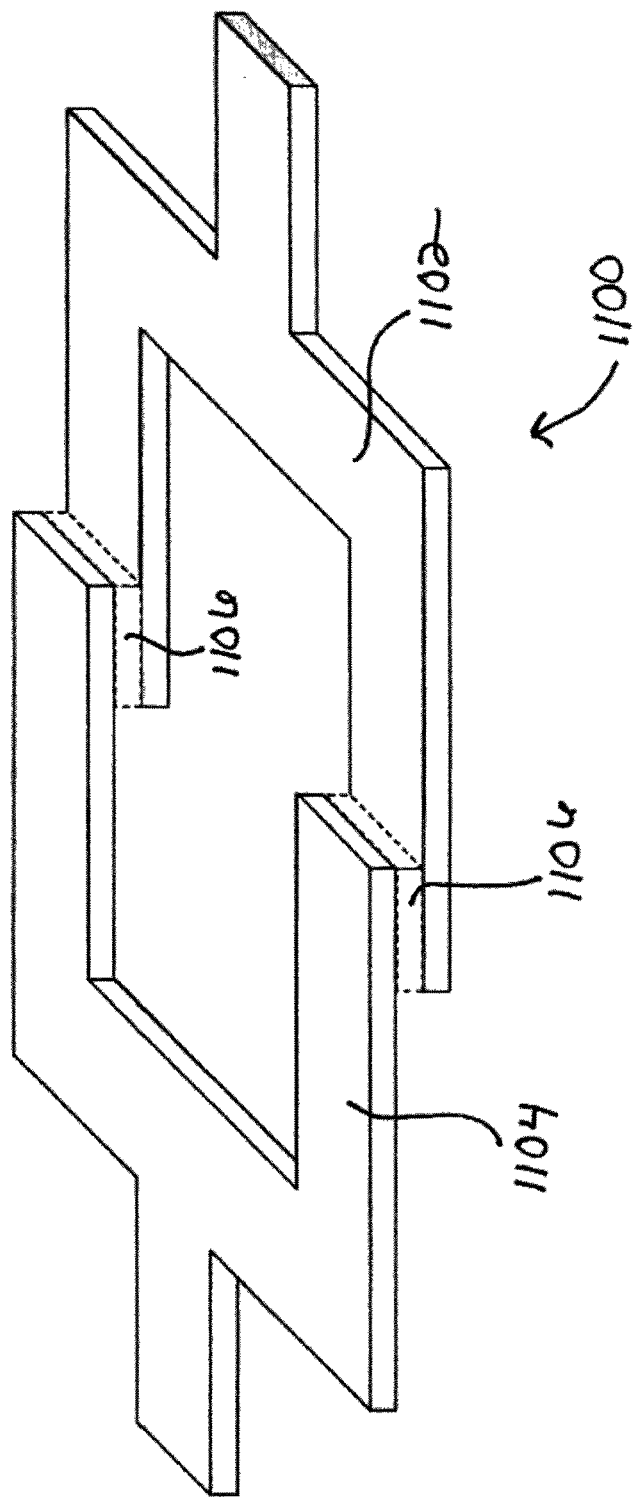
FIG. 11 is a perspective view of a superconducting quantum interference device (SQUID) 1100 of the present invention with the crystal removed for illustration purposes.

As illustrated in FIG. 11, the present invention provides a semiconductor-based superconducting quantum interference device (SQUID) 1100. Similar to the devices illustrated and described in FIGS. 5-8, the SQUID 1100 is formed within a crystal. For simplicity, the crystal in which the SQUID is formed is not illustrated. The SQUID 1100 includes a first generally U-shaped superconducting region 1102 and a second generally U-shaped superconducting region 1104. Free ends of the second region 1104 are positioned over, but spaced from, free ends of the first region 1102 to generally form a loop. The SQUID 1100 further includes two Josephson junctions 1106. Although the SQUID 1100 illustrated in FIG. 11 includes two Josephson junctions it is understood that the SQUID 1100 may include any number of Josephson junctions including only one Josephson junction. In addition, the Josephson junctions provided by the SQUID 1100 may be tunneling JJs or weak link JJs. Although the superconducting regions 1102 and 1104 of the SQUID 1100 are illustrated as "floating", it is to be understood that the superconducting electrodes 1102, 1104 of the SQUID 1100 may be connected to other superconducting or normal metal circuits or coupled capacitively or inductively to other circuits or transmission lines. Because the SQUID is formed with the crystal, only epitaxial interfaces are provided by the SQUID.

The following calculations illustrate use of the superconducting regions of the present invention to form a SQUID. Unlike the tunneling junction or the weak link junction, dc SQUID applications require that the hysteresis in the I-V curve is avoided. Thus, an over dampened JJ is required with a junction quality factor, Q, smaller than 1. The junction quality factor is provided by $Q=\omega_p R C_j$, where $\omega_p=\sqrt{2E_C E_J}/\hbar$ is the plasma frequency of the JJ. If a weak link junction is utilized to provide the SQUID, R is of the order $R_n$. If a tunneling junction is utilized to provide the SQUID, R is of the order $R_n e^{\Delta/k_B T}$. For the superconducting tunneling junctions to satisfy Q<1, typically a shunting resistance is required to reduce the total resistance, since R is very large for an isolated tunnel junction. The use of a shunting resistance should be avoided for quantum applications. Alternatively, Superconducting-Insulator-Normal metal-Insulator-Superconducting (SINIS)-type junctions may be advantageous for achieving an over damped JJ. For the weak link, $Q=5.5\times10^{-3}\sqrt{A/A_{wl}}$ and for $A_{wl}=100$ nm$^2$, A<3.3 µm$^2$, allowing much smaller size than the STJ.

By satisfying the following conditions, magnetic hysteresis in the SQUID 1100 of FIG. 11 is avoided. $B_m=2LI_c/\Phi_0<1$, where L is the inductance of the SQUID loop. STJs can easily satisfy this since the critical current is small, but a fairly large loop would be needed due to the large junction area A≈1 µm$^2$ required to overcome the thermal fluctuations as discussed above. On the other hand, weak-link JJs open up the possibility of a nanoscale SQUID. For a square loop of area 1 µm×1 µm, the geometrical inductance L is ≈2 pH for wire diameter of a few tens of nm. Assuming that the relative permeability of doped Si is one like most nonmagnetic metals. Then, $\beta_m<1$ translates into $A_{wl}/d<2\times10^3$ nm. Typically values $A_{wl}\approx100$ nm$^2$ and d≈10 nm would be suitable for a nano-SQUID. Compared with nano-SQUID based on the metallic bridges, much shorter weak links are possible due to the much higher precision of STM lithography over electron-beam lithography, allowing one to reach the short link limit with highly nonlinear inductance and larger modulation depth in critical current.

Figure 13:
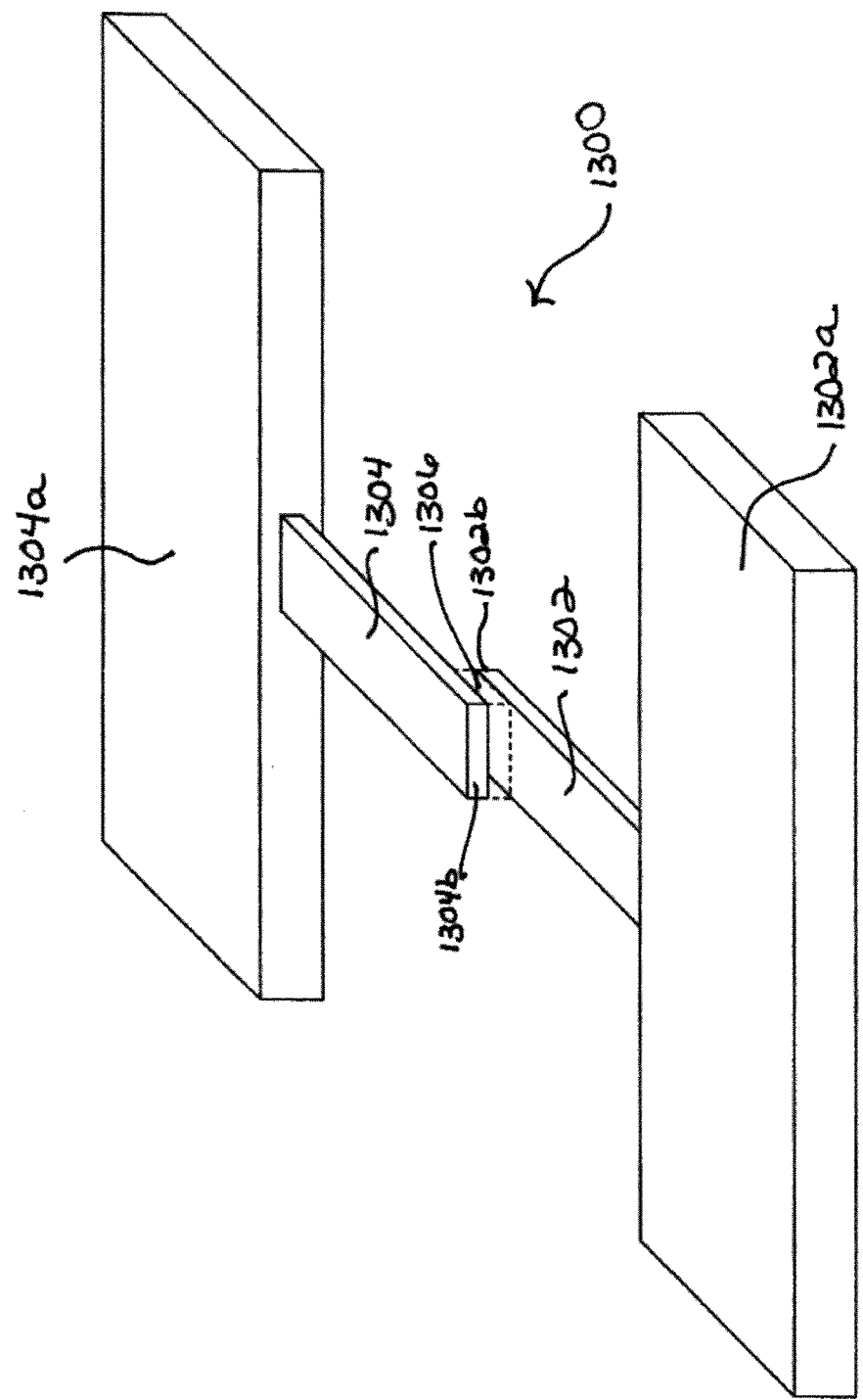
FIG. 13 is a perspective view of a superconducting charge qubit of the present invention with the crystal removed for illustration purposes.
Figure 14:
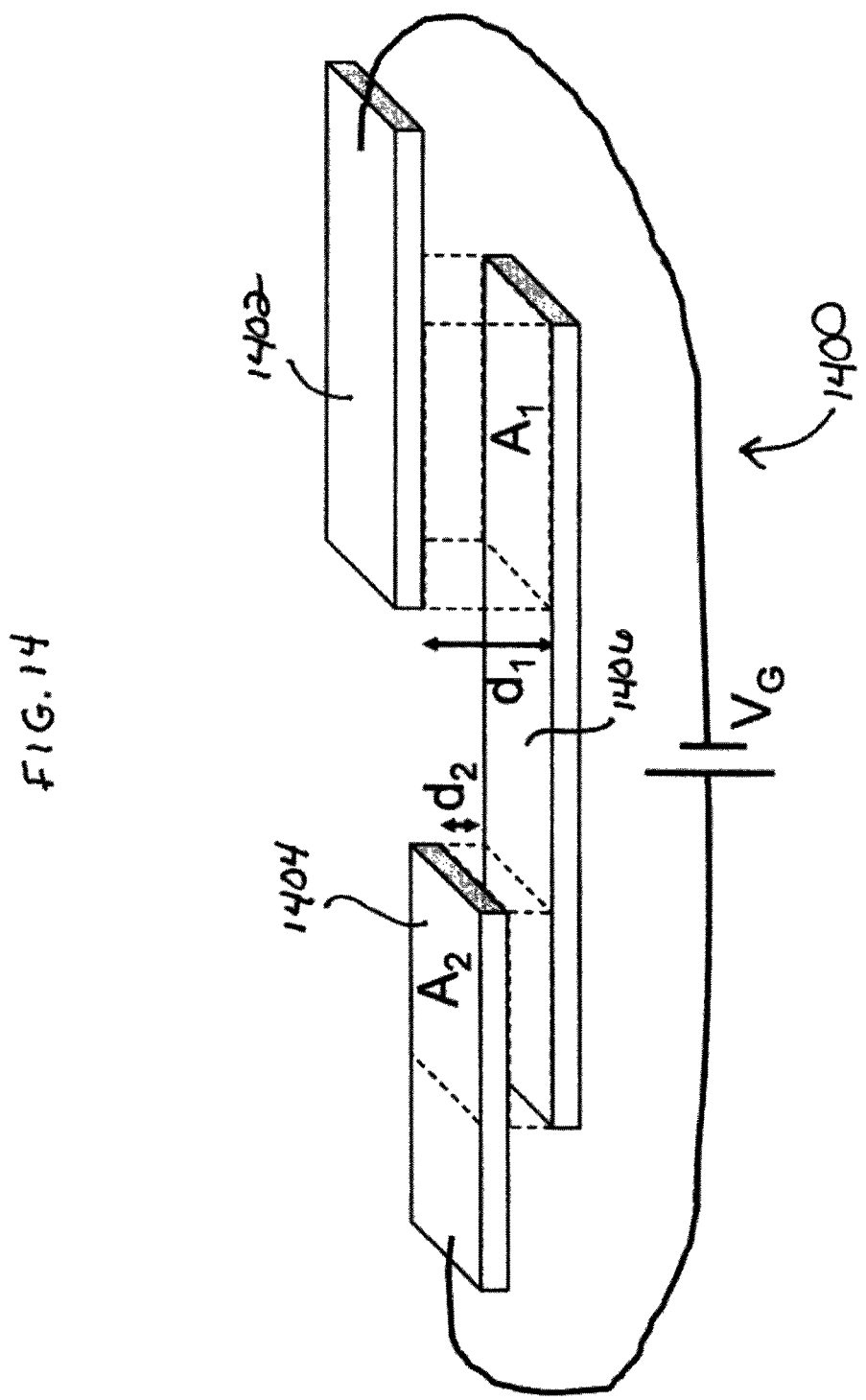
FIG. 14 is a perspective view of a superconducting charge qubit of the present invention with the crystal removed for illustration purposes and wherein the charge qubit is illustrated along with the circuit equivalent of a voltage gate.
Figure 15:
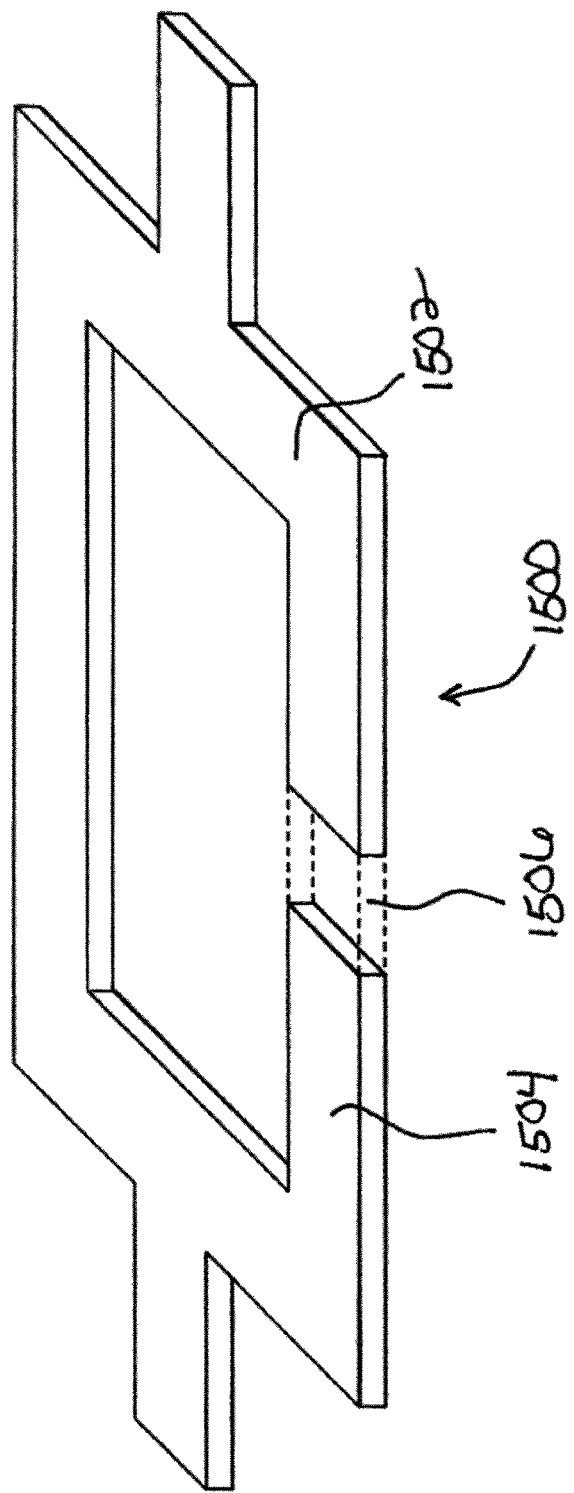
FIG. 15 is a perspective view of a superconducting flux qubit of the present invention with the crystal removed for illustration purposes.

The present inventions provides for the formation of qubits. Charge qubits 1300, 1400 are illustrated in FIGS. 13 and 14 and a flux qubit 1500 is illustrated in FIG. 15. These charge and flux superconducting qubits are utilized to illustrate relevant parameters, it is noted, however, that more complicated designs are also possible and would relax the restrictions on the parameters significantly. Similar to the devices illustrated and described in FIGS. 5-8, the qubits 1300, 1400, and 1500, are formed with a crystal. For simplicity, the crystals in which each of the illustrated qubits is formed is not illustrated.

A charge qubit is a single Cooper pair box connected to a JJ where the two discrete low-energy levels form a logical qubit space. As illustrated in FIG. 13, the charge qubit 1300 includes a first superconducting region 1302 and a second superconducting region 1304. Each superconducting region 1302, 1304 includes an enlarged portion 1302a, 1304a. A free end 1304b of the second superconducting region 1304 overlaps a free end 1302b of the first superconducting region 1302 such that an overlap region is defined. A barrier 1306 is provided within the overlap region. An alternative charge qubit 1400 is illustrated in FIG. 14. The charge qubit 1400 includes a first superconducting region 1402, a second superconducting region 1404, and a third superconducting region or island 1406. A portion of each of the first and second superconducting regions 1402, 1404 overlaps a portion of the third superconducting region 1406. Thus a first overlapping region having a cross-sectional area $A_1$ is provided by the first superconducting region 1402 to form a first JJ and a second overlapping region having a cross-sectional area $A_2$ is provided by the second superconducting region 1404 to provide a second JJ. A distance $d_1$ is provided between the first superconducting region 1402 and the third superconducting region 1406. A distance $d_2$ is provided between the second superconducting region 1404 and the third superconducting region 1406. The qubit 1400 is provided in a crystal 1410.

As further illustrated in FIG. 14, a gate voltage, $V_G$, may be applied to the first and second superconducting regions 1402 and 1404 to tune the system to reduce the effects of the charge noise. Alternatively, the known sensitivity to charge noise of the charge qubit may be used to provide a probe of the charge environment of this system.

By choosing different geometries for the two tunnel junctions, for example $d_2<3$ nm and $d_1>10$ nm, the second junction can provide sufficiently large Josephson energy to act as a JJ, while the first junction has negligible JJ energy and can be considered as a simple capacitor with capacitance $C_g$. The charge qubit is operated in a regime $k_B T \ll E_J \approx E_c \ll \Delta$ where $E_c$ is now the total charging energy $E_c=(2e)^2/2(C_2+C_g)$. Assuming T=10 mK, a JJ with $d_2=2.5$ nm means that $A_2$ should be ≈1 µm2. The charging energy $E_c$=3.0 eVnm×1/($A_2/d_2+A_1/d_1$) with $d_2$=2.5 nm and $A_2$=1 µm² constrains the geometry of the capacitor $A/d \ll 3.1 \times 10^6$ nm. So we can choose, for example, $A_1 \approx 10^6$ nm² and $d_1 \approx 20$ nm.

It is noted that, high JJ critical current makes the phase qubit a good choice for the weak-link JJ. A phase qubit operates in a regime with $k_B T \ll E_c \ll E_J$, which translates into $d/A \gg 3 \times 10^{-7}$ nm$^{-1}$ and $AA_{wl}/d^2 \gg 7.7 \times 10^3$ nm². A reasonable set of parameters would be, for example, $d \approx 10$ nm, $A_{wl} \approx 100$ nm² and $A \approx 10^6$ nm².

FIG. 15 illustrates a simple model of a flux qubit 1500. In addition, the SQUID illustrated in FIG. 11, if operated in a different parameter regime than the SQUID device, illustrates a flux qubit. Similar to the devices illustrated and described in FIGS. 5-8, the flux qubit 1500 is formed with a crystal. For simplicity, the crystal in which the flux qubit 1500 is formed is not illustrated. The flux qubit 1500 includes a first generally U-shaped superconducting region 1502 and a second generally U-shaped superconducting region 1504. Free ends of the second region 1504 are spaced from free ends of the first region 1502 to generally form a loop. The qubit 1500 further includes two Josephson junctions 1506. The qubit 1500 provides a loop with a JJ (radio frequency (rf)-SQUID loop) coupled to an externally supplied flux. The flux qubit 1500 operates usually with $L_j \lesssim L$, where $L_j = \Phi_0 / 2\pi I_c$. The loop inductance is relatively quite small compared with $L_J$ for the typical geometries we have considered so far. This restriction can be lifted by using, for example, a three JJ loop.

More advanced qubits, such as the transmon qubit, are realizable by incorporating a big capacitance in the system. A transmon qubit is a type of charge qubit designed to be insensitive to charge noise. As an example, a large tunnel Josephson junction can be created to form a transmon qubit. FIG. 12 and FIG. 13 provide example geometries of such a transmon qubit. As illustrated in FIG. 12, the transmon may be formed completely epitaxially and then etched resulting in non-epitaxial interfaces. The parameters of the superconducting JJ circuit are tuned such that $E_J \gg E_c$. Typically an $E_J \sim 10$ is chosen to achieve sufficient anharmonicity to create a qubit, but maintain insensitivity to charge fluctuations. The qubit state energy difference approaches the JJ plasma frequency, $\hbar \omega_p = \sqrt{2 E_c E_J}$. For a Josephson junction geometry as shown in FIG. 12, the plasma frequency can be related to the critical geometric parameters as $$\omega_p = \sqrt{\left(\frac{2e}{\hbar}\right)\left(\frac{d}{\varepsilon_r \varepsilon_0}\right) J_C},$$

where $J_c$ is the critical current density Jc=Ic/A. For a typical target frequency of $\omega_p/2\pi$=5 GHz and $E_J/E_C$=10, the necessary distance separating the two superconductor regions is d=1.46 nm and A=1.13 square microns.

The superconducting region 300 of FIG. 3 can be utilized to provide a new kinetic inductance particle detector. The new particle detector is provided by placing the superconducting region 300 of FIG. 3 into a superconductor resonator circuit. In operation, if a photon or phonon with energy greater than the superconducting energy gap is absorbed in the superconductor region, one or more Cooper pairs are broken creating quasiparticles. This increases the residual resistance and the kinetic inductance of the superconducting semiconductor region 300. This increase can be detected by measuring phase of a transmitted microwave signal through a nearby transmission line coupled to the resonator circuit in which the superconducting-semiconductor region 300 is placed. Notably, since the superconducting energy gap is directly related to the critical temperature of the superconductor region which is related to the carrier density as described above, the invention described here offers a way to tune the detector sensitivity to particles of specific energy: either by changing the dopant density during formation of the superconductor region (by incorporating less dopants) or by modifying the carrier density by means of a top gate as described above.

The invention provides a method for forming epitaxial superconductor regions having epitaxial semiconductor interfaces. The superconductors formed using the method of the present invention may provide components used to create the superconducting elements (e.g. wires, JJs, and capacitors) and devices (e.g. qubits) described above.

Before the superconductor region may be formed, the dimension and the parameters of the superconductor must be determined. For example, determination of the dimensions and parameters includes the following.

Selecting the device to be formed (e.g. wire, capacitor, JJ, qubit, etc.) and determining the basic parameters of the selected device. (e.g. if the device to be formed is a qubit, determine $E_c$ and $E_J$.

Selection of the type of crystal to be formed.

Determination of the critical temperature, $T_c$, of the superconducting region required.

Selection of the passivation substance, if one is to be used.

Selection of the acceptor to be used to dope the crystal.

Selection of the acceptor molecule used to absorb the acceptor to the crystal surface.

Selection of a doping rate given the determined maximum doping rate (determined by prior experiments on single dopant sheets and subsequent imaging to determine the doping rate achieved).

Selection of the length and width of the superconductor to be formed.

Calculating the dopant density required to reach the sought after critical temperature.

Calculating the frequency at which subsequent monolayers will be doped (i.e. determining a value for k) given the maximum frequency possible.

Calculating the number of monolayers that must be grown in the doped region given above to reach the calculated dopant density.

Figure 16:
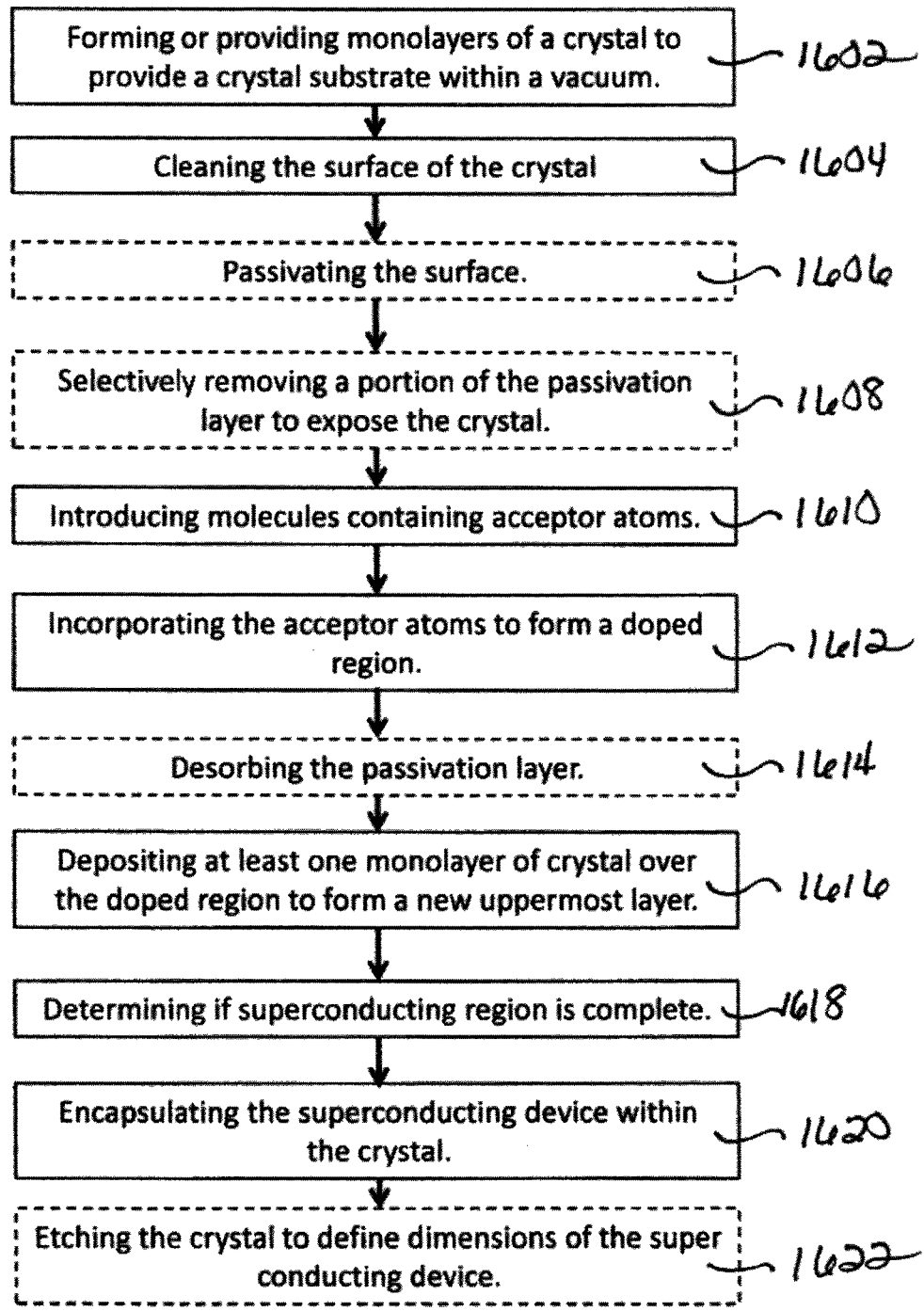
FIG. 16 is a block diagram illustrating a method of the present invention.

With the above information, the present invention provides a method of forming a superconducting device. The method 1600 is illustrated in FIG. 16. The method of the present invention begins at step 1602 by forming a crystal substrate within a vacuum in accordance with known practices. The crystal may be formed from silicon or another Group IV semiconductor. For example, the crystal may be formed from silicon, germanium or diamond.

Next at step 1604, the surface of the crystal is cleaned by, for example, heating (flashing) the surface at high temperature and in low-pressure (ultra-high-vacuum).

Once the surface has been cleaned, at step 1606 the surface of the uppermost layer of the crystal is passivated. The surface can be passivated, for example, by depositing a monolayer of hydrogen on the surface of the crystal. As will be described below, in some instances the step of passivating is not required, therefore this step has been illustrated in broken line to represent that the step is optional.

Next, at step 1608 hydrogen atoms forming the passivation layer are selectively removed to expose a portion of the crystal surface. This step of selectively removing portions of the passivation layer may be performed using STM lithography or SEM, for example. Specifically, if a hydrogen passivation layer is utilized, the STM tip may be used to selectively remove some of the hydrogen atoms on the surface (either across broad swaths of the crystal surface or down to single hydrogen atoms), exposing regions of unmasked silicon atoms. It is understood that other lithographic processes may be used to expose portions of the crystal surface. As with step 1606, step 1608 is also optional.

With a portion of the passivation layer removed, the next step 1610 provides for the introduction of molecules containing impurity atoms to the vacuum to form a monolayer of impurities on the exposed portion of the uppermost monolayer of the crystal. In the event steps 1606 and 1608 have not been performed, the molecules are introduced to the entire surface of the uppermost monolayer of the crystal. The molecules introduced may be, for example diboride gas, providing boron acceptor atoms. These molecules bind with the exposed portions of the crystal surface. Possible acceptor impurities include boron, aluminum, galium, and indium, for example.

Next at step 1612, the impurity atoms are incorporated into the crystal to provide a doped region of the crystal. To provide for the incorporation of the impurity atoms in the crystal an annealing process may be used. For example, in the case of prior art where $PH_3$ is introduced to a silicon crystal, annealing at 350° allows recombination/dissociation to take place resulting in a P atom incorporated into the top silicon layer ejecting a silicon atom. In this way, P atoms are incorporated into the exposed regions via atomic layer doping, with positioning accuracy to one lattice site. The resulting 1D or 2D impurity sheet could reach very high doping rate, up to one in every four silicon atoms being replaced with a P atom.

Next, at step 1614, if a passivation layer was deposited at step 1606, the passivation layer is desorbed.

Next, at step 1616, a monolayer of crystal is formed over the monolayer where the doped region resides to form a new uppermost monolayer of the crystal. The monolayer of crystal is formed by using, for example, molecular beam epitaxy (MBE).

If it has been determined that each monolayer of the crystal in the doped region will be doped (i.e. if k=1), doping step 1610 which provides for the introduction of impurity molecules containing acceptor atoms is again performed. Alternatively, if it has been determined that multiple monolayers will be formed in the doping region before doping occurs again step 1616 which provides for depositing/forming a monolayer is repeated as necessary prior to the doping step 1610. For example, if it has been determined that every other monolayer is to be doped, then two monolayers of crystal will be formed prior to repeating the step of doping. Or, if it has been determined that every third monolayer is to be doped, then three monolayers of crystal will be formed prior to repeating the step of doping.

Next, at step 1618, it is determined whether formation of the superconducting region is complete. If formation of the superconducting region is not complete, the process returns to the doping step of 1610 where impurity molecules are introduced to the new uppermost region of the crystal. This process of forming and doping monolayers is repeated until the superconductor reaches the desired height to reach the required impurity density, thereby providing an epitaxially formed superconductor region.

When at step 1618, it is determined that formation of the superconducting device is complete, at step 1620 additional layers of crystal are grown over the superconductor to encapsulate the epitaxially formed superconducting region.

At step 1622 the encapsulated superconducting device may be etched in accordance with known practices, to define the dimensions of the super conducting device. For example, in the instance that steps 1606, 1608 and 1614 are not utilized to provide a passivation layer and to define a doping region, at step 1622, the dimension of the superconducting device may be formed via etching to create a wire, loop, or other shaped superconductor region of finite dimension. An example of a device formed utilizing this alternate method is illustrated in FIG. 12. Material in the region 1220, for example was removed by, for example, etching. Thus, a portion of the initially formed superconducting regions 1202 and 1204 were removed along with a portion of the barrier region 1206 and the upper crystal region 1210b. Here, the superconductor-vacuum interface and substrate vacuum interface exist, but at least one interface between crystal and superconductor region is epitaxial offering advantages as described below.

Although FIG. 12 illustrates formation of a JJ with at least one epitaxial interface, it is to be understood that other devices, for example, capacitors, qubits, and other complex devices can be made in this manner as well.

The method of the present invention provides for the precise placement of the superconducting regions within the crystal. Therefore, a variety of elements and devices can be formed using these superconducting regions having epitaxial interfaces with crystal regions. As shown in FIG. 3 the superconducting region may simply be used as a wire. Alternatively, the superconductor region may be formed along with other components to form other elements or devices. For example, additional superconducting regions may be formed in the same plane to form superconducting regions of Josephson junctions such as those illustrated in FIGS. 6 and 8. To do so, the removal step 1608 is used to expose two areas of the crystal surface and the co-planar superconducting regions are simultaneously formed. The junction region between the co-planar first and second superconducting regions provides a barrier between the superconducting regions. Vertically spaced superconducting regions, such as those provided by the Josephson junctions of FIGS. 5 and 7 and 12 may also be formed. To form these vertically spaced superconducting regions, the upper superconducting region is formed after formation of the lower electrode is complete. A junction region is formed between the lower and upper superconducting regions by growing layers of crystal after formation of the lower superconducting regions and before formation of the upper superconducting region.

In the case of the weak link Josephson junctions illustrated in FIGS. 7 and 8, for example, the weak link is formed by, for example, exposing a third region of the crystal, to form a junction region connecting the two superconducting regions. The junction region is formed such that the width or height (i.e., the number of doped monolayers grown) is smaller than the first and second superconducting regions or has lower doping density. The doped junction region which provides the weak-link may act as a superconductor with weakened superconductivity relative to the other superconductor regions, or may behave as a normal metal due to the density being lower than that needed for superconductivity.

In addition to forming relatively basic superconducting devices, the epitaxially formed superconducting regions of the present invention can be used to form the more complex superconducting circuits described above. For example, as mentioned above, qubits or SQUIDs can be formed utilizing the method of the present invention.

The invention obviates the need for multiple materials to form superconducting elements and devices (e.g. Josephson junction devices), instead building such systems out of the ultra-clean semiconductor itself. The superconductor used to form these devices is formed by introducing impurities (i.e. doping the semiconductor) in certain regions. Insulating or normal metal regions are produced either by fiat out of the intrinsic semiconductor (i.e. no doping is necessary) to create an insulating region or via doping at a lower lower density for normal metal regions.

Importantly, there are no non-epitaxial interfaces between the superconductor and the nominally perfectly crystal in which the device is made from. The invention replaces the metal with an impurity-doped crystal region (of the same crystal), and constructs the devices inside the crystal, well away from any interfaces (or by creating devices that minimize the effect from any interface by using at least one epitaxial superconductor-crystal interface). The interface between the semiconductor and other materials (where loss mechanisms often occur) can be chosen to be far away from the device or form critical regions within the device. Thus, the homogenous system (i.e. the single crystal) negates the negative effects (e.g. loss or noise) of the substrate, barrier, and vacuum interfaces found in the prior art.

Fabricating superconductor devices out of a crystal while utilizing precise implantation techniques may enable new parameter regimes for superconducting devices, and thus potentially new devices with better properties for, as examples, classical computing, quantum computing, or sensing/detection of electromagnetic fields/particles. Superconducting devices based on the invention could be made smaller than device made with known techniques.

Building superconducting devices inside and made-out-of an industry-standard semiconductor such as silicon or germanium may enable new possibilities of integration between standard electronics and superconducting devices with the potential for new devices and better manufacturing economics.

While preferred embodiments of the present invention are shown and described, it is envisioned that those skilled in the art may devise various modifications of the present invention without departing from the spirit and scope of the appended claims.

The invention claimed is:

1. A method forming a superconducting region comprising the steps of:
   a. providing monolayers of a crystal;
   b. cleaning the surface of said crystal;
   c. introducing a plurality of molecules containing acceptor atoms to an uppermost monolayer of the crystal, thereby allowing said acceptor atoms to bind with said crystal;
   d. allowing said acceptor atoms to incorporate into said crystal to provide a doped region of said crystal;
   e. growing at least one monolayer of crystal over said doped region to form a new uppermost layer;
   f. repeating steps c-e until a density of said acceptor atoms in said doped region is sufficient to allow the doped region to function as a superconductor at a desired critical temperature; and
   g. encapsulating said superconducting region by growing a monolayer of crystal over said superconducting region.

2. The method of claim 1, wherein said acceptor atoms are selected from Group III.

3. The method of claim 1, wherein the density of acceptors $n_h$ is determined by: $n_h = (rDN1/b^2)/[(a/4)(N1-1)k + dB]$, where
   $r_D$ represents the rate of doping;
   $N_1$ represents the number of monolayers which have been doped;
   b represents the distance between neighboring crystal sites;
   a represents the lattice constant of the crystal;
   k represents the frequency with which monolayers are doped; and
   $d_B$ represents the diameter of the effective electron density region.

4. The method of claim 1, further including the step of:
   repeating steps c-g to form an additional superconductor within the crystal.

5. The method of claim 1, further comprising the steps of:
   determining the width and length of a superconducting device to be formed utilizing said superconducting regions; and
   etching said monolayers of said crystal to form the superconducting device.

6. A method forming a superconducting region comprising the steps of:
   a. providing monolayers of a crystal;
   b. cleaning the surface of said crystal;
   c. depositing a passivation layer on an uppermost monolayer;
   d. selectively removing a portion of said passivation layer to expose a portion of said uppermost monolayer;
   e. introducing a plurality of molecules containing acceptor atoms to said uppermost monolayer of the crystal, thereby allowing said acceptor atoms to bind with said crystal;
   f. allowing said acceptor atoms to incorporate into said crystal to provide a doped region of said crystal;
   g. desorbing the passivation layer;
   h. growing at least one monolayer of crystal over said doped region to form a new uppermost layer;
   i. repeating steps c-h until a density of said acceptor atoms in said doped region is sufficient to allow the doped region to function as a superconductor at a desired critical temperature; and
   j. encapsulating said superconducting region by growing a monolayer of crystal over said superconducting region.

7. The method of claim 6, wherein said acceptor atoms are selected from Group III.

8. The method of claim 6, wherein the density of acceptors $n_h$ is determined by: $n_h = (rDN1/b^2)/[(a/4)(N1-1)k + dB]$, where
   $r_D$ represents the rate of doping;
   $N_1$ represents the number of monolayers which have been doped;
   b represents the distance between neighboring crystal sites;
   a represents the lattice constant of the crystal;
   k represents the frequency with which monolayers are doped; and
   $d_B$ represents the diameter of the effective electron density region.

9. The method of claim 6, wherein said passivation layer is provided by hydrogen.

10. The method of claim 6, wherein said step of selectively removing is provided by lithography.

11. The method of claim 6, wherein said step of selectively removing is provided by an STM.

12. The method of claim 6, further comprising the steps of:
  determining the width, length and depth of the superconducting region to be formed,
  determining the portion of said passivation layer to be removed based upon said determined width and length of said superconducting region; and
  wherein the number of times said steps of growing to form a new uppermost layer and introducing acceptors is determined by said determined depth of said superconducting region.

13. The method of claim 6, further including the step of:
  repeating steps c-i to form an additional superconductor within the crystal.

14. The method of claim 13, wherein a tunneling Josephson Junction is formed: wherein a charging-energy Ee of said Josephson junction is approximated by $Ec=((2e)^2/2)(d/\varepsilon r\varepsilon 0 A)$, where e represents electron charge, d represents the distance between superconducting regions of the Josephson Junction, $\varepsilon r$ represents the permittivity of said crystal, $\varepsilon 0$ represents the permittivity of a vacuum, and A represents the area of an overlapping portion of said superconducting region; wherein a junction energy E1 of said Josephson junction is approximated by $Ej=[h\pi\Delta(0)]/[(2e)^2 Rn]$, where h represents Planck's constant, and $\Delta$ represents the superconducting energy gap; and wherein the normal resistance Rn of said Josephson junction is defined by $Rn=10^4 e^5.6d/A$.

15. The method of claim 6, wherein a Josephson junction is formed.

16. The method of claim 15, wherein a tunneling Josephson junction is formed:
  Wherein a charging energy Ec of said Josephson junction is approximated by $Ec=((2e)^2/2)(d/\varepsilon r\varepsilon 0 A)$, where e represents electron charge, d represents the distance between superconducting regions of the Josephson Junction, $\varepsilon_r$ represents the permittivity of said crystal, $\varepsilon_0$ represents the permittivity of vacuum, and A represents the area of an overlapping portion of said superconducting region; wherein a junction energy Ej of said Josephson Junction is approximated by $Ej=[h\pi\Delta(0)]/[(2e)^2 Rn]$, where h represents Planck's constant divided by $2\pi$ and $\Delta$ represents the superconducting energy gap; and wherein the normal resistance Rn of said Josephson Junction is defined by $Rn=10^4 e^5.6d/A$.

17. The method of claim 15, wherein a weak link Josephson Junction is formed including a weak link region: wherein a charging energy $E_c$ of said Josephson Junction is approximated by $E_c=((2e)^2/2)(d/\varepsilon r\varepsilon 0 A)$, where e represents electron charge, d represents the distance between superconducting regions of the Josephson Junction, $\varepsilon_r$ represents the permittivity of said crystal, $\varepsilon_0$ represents the permittivity of vacuum, and A represents the area of an overlapping portion of said superconducting region; wherein a junction energy Ej of said Josephson Junction is approximated by $Ej=[h\pi\Delta(0)]/[(2e)^2 Rn]$, where h represents Planck's constant divided by $2\pi$ and $\Delta$ represents the superconducting energy gap; and wherein the normal resistance Rn of said Josephson Junction is defined by $R_n=\rho_n d/A_{wl}$, where $\rho_n$ is the resistivity of the weak link region and $A_{wl}$ is the area of the weak link region.

18. The method of claim 6, wherein a qubit is formed.

* * * * *